(12) United States Patent
Higashi et al.

(10) Patent No.: US 12,532,690 B2
(45) Date of Patent: Jan. 20, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventors: Katsuei Higashi, Kyoto (JP); Toru Endo, Kyoto (JP); Yusuke Takematsu, Kyoto (JP); Keisuke Takagi, Kyoto (JP); Naohiko Yoshihara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 326 days.

(21) Appl. No.: 18/186,643

(22) Filed: Mar. 20, 2023

(65) Prior Publication Data

US 2023/0307258 A1 Sep. 28, 2023

(30) Foreign Application Priority Data

Mar. 25, 2022 (JP) ................................. 2022-049633
Sep. 22, 2022 (JP) ................................. 2022-151295

(51) Int. Cl.
*H01L 21/67* (2006.01)

(52) U.S. Cl.
CPC .............................. *H01L 21/67023* (2013.01)

(58) Field of Classification Search
CPC ......... H01L 21/32134; H01L 21/30604; C23F 1/16
See application file for complete search history.

(56) References Cited

U.S. PATENT DOCUMENTS

| 9,340,761 | B2 | 5/2016 | Negoro et al. |
| 9,403,187 | B2 | 8/2016 | Negoro et al. |
| 10,403,517 | B2 | 9/2019 | Kobayashi et al. |
| 10,464,107 | B2 | 11/2019 | Iwata et al. |
| 11,052,432 | B2 | 7/2021 | Hayashi et al. |

(Continued)

FOREIGN PATENT DOCUMENTS

| JP | 2009016497 A | 1/2009 |
| JP | 2015050350 A | 3/2015 |

(Continued)

OTHER PUBLICATIONS

Office Action mailed Jan. 4, 2024 issued in corresponding Taiwanese Patent Application No. 112107830.
Office Action dated Apr. 25, 2024 for corresponding Korean Patent Application No. 10-2023-0032910.

*Primary Examiner* — Thomas T Pham
(74) *Attorney, Agent, or Firm* — OSTROLENK FABER LLP

(57) ABSTRACT

A substrate processing apparatus includes a first tank, a path including a first path, a first heater, a hydrogen peroxide supply path, and a controller. The first path allows sulfuric acid to be supplied therethrough from the first tank to a nozzle. The first heater heats a heating region of the first path. The controller controls ejecting sulfuric acid heated by the first heater and a hydrogen peroxide solution from the nozzle onto a substrate, the sulfuric acid and the hydrogen peroxide solution on the substrate having been mixed, and then ejecting sulfuric acid having a temperature lower than a temperature of the sulfuric acid heated by the first heater and the hydrogen peroxide solution from the nozzle onto the substrate, the sulfuric acid and the hydrogen peroxide solution on the substrate having been mixed.

6 Claims, 22 Drawing Sheets

(56) References Cited

U.S. PATENT DOCUMENTS

| | | |
|---|---|---|
| 11,056,335 B2 | 7/2021 | Higashijima et al. |
| 11,318,504 B2 | 5/2022 | Kawaguchi et al. |
| 2015/0060406 A1 | 3/2015 | Negoro et al. |
| 2015/0060407 A1 | 3/2015 | Negoro et al. |
| 2015/0114432 A1 | 4/2015 | Iwata et al. |
| 2016/0093486 A1* | 3/2016 | Miyazaki ............ H01L 21/6708 134/18 |
| 2016/0236241 A1 | 8/2016 | Negoro et al. |
| 2016/0240399 A1 | 8/2016 | Kobayashi et al. |
| 2018/0090306 A1 | 3/2018 | Higashijima et al. |
| 2019/0295839 A1 | 9/2019 | Endo et al. |
| 2019/0308224 A1 | 10/2019 | Hayashi et al. |
| 2020/0144081 A1 | 5/2020 | Tsujikawa et al. |
| 2020/0152443 A1 | 5/2020 | Higashijima et al. |
| 2021/0252560 A1 | 8/2021 | Kawaguchi et al. |
| 2022/0219209 A1 | 7/2022 | Kawaguchi et al. |

FOREIGN PATENT DOCUMENTS

| | | |
|---|---|---|
| JP | 2015050351 A | 3/2015 |
| JP | 2015109335 A | 6/2015 |
| JP | 2020047857 A | 3/2020 |
| KR | 10-2018-0035151 A | 4/2018 |
| TW | 201705203 A | 2/2017 |
| TW | 201911400 A | 3/2019 |
| TW | 201941289 A | 10/2019 |

* cited by examiner

SUBSTRATE PROCESSING APPARATUS AND SUBSTRATE PROCESSING METHOD

INCORPORATION BY REFERENCE

The present application claims priority under 35 U.S.C. § 119 to Japanese Patent Application Nos. 2022-049633 and 2022-151295, filed on Mar. 25, 2022 and Sep. 22, 2022, respectively. The contents of these applications are incorporated herein by reference in their entirety.

BACKGROUND

The present disclosure relates to a substrate processing apparatus and a substrate processing method.

A substrate processing apparatus that processes substrates are conventionally used in the manufacturing process of devices including substrates, such as semiconductor devices and liquid crystal display devices. The substrate is, for example, a semiconductor wafer or a glass substrate for a liquid crystal display device.

For example, a substrate processing apparatus is known that supplies a sulfuric acid-hydrogen peroxide mixture to the surface of a substrate. Here, the sulfuric acid-hydrogen peroxide mixture is produced by mixing sulfuric acid with a flow rate of 1 at 170° C. or higher and a hydrogen peroxide solution with a flow rate of 0.1 to 0.35.

In the substrate processing apparatus described above, a sulfuric acid-hydrogen peroxide mixture is supplied to the surface of a substrate. In this case, when sulfuric acid and a hydrogen peroxide solution are mixed, the sulfuric acid and the hydrogen peroxide solution react, and the temperature of the sulfuric acid-hydrogen peroxide mixture becomes high. After the substrate is supplied with the high-temperature sulfuric acid-hydrogen peroxide mixture and is processed, the sulfuric acid-hydrogen peroxide mixture on the substrate is rinsed away with the hydrogen peroxide solution.

In order to rinse away the high-temperature sulfuric acid-hydrogen peroxide mixture on the substrate, the supply of sulfuric acid is stopped and only the hydrogen peroxide solution is supplied. In this case, the high-temperature sulfuric acid-hydrogen peroxide mixture violently reacts with the supplied hydrogen peroxide solution to further raise the temperature, and the temperature of the substrate also rises. After that, by continuing to supply the hydrogen peroxide solution, the high-temperature sulfuric acid-hydrogen peroxide mixture is removed from the substrate, and the temperature of the substrate is rapidly lowered by the supplied hydrogen peroxide solution.

In this method, the high-temperature sulfuric acid-hydrogen peroxide mixture becomes higher in temperature due to the hydrogen peroxide solution, and the temperature of the substrate changes rapidly. Therefore, the substrate may be damaged such as peeling of the pattern on the substrate. As a method of improving this, it is conceivable to change the mixing ratio (concentration of sulfuric acid) of sulfuric acid and hydrogen peroxide solution, but it takes time to adjust the mixing ratio to a desired ratio.

SUMMARY

A substrate processing apparatus according to an aspect of the present disclosure processes a substrate by supplying a processing liquid to the substrate from a nozzle. The substrate processing apparatus includes a first tank, a path including a first path, a first valve, a first heater, a hydrogen peroxide supply path, a hydrogen peroxide valve, and a controller. The first tank stores sulfuric acid. The first path that allows the sulfuric acid to be supplied from the first tank to the nozzle therethrough. The first valve that is placed in the first path. The first heater heats a heating region of the first path. The hydrogen peroxide supply path allows a hydrogen peroxide solution to be supplied to the nozzle therethrough. The hydrogen peroxide valve is placed in the hydrogen peroxide supply path. The controller controls supply of the sulfuric acid and the hydrogen peroxide solution to the nozzle by controlling opening and closing of the first valve and the hydrogen peroxide valve. The controller controls ejecting sulfuric acid heated by the first heater and the hydrogen peroxide solution from the nozzle onto the substrate, the sulfuric acid and the hydrogen peroxide solution on the substrate having been mixed. The controller then controls ejecting sulfuric acid having a temperature lower than a temperature of the sulfuric acid heated by the first heater and the hydrogen peroxide solution from the nozzle onto the substrate, the sulfuric acid and the hydrogen peroxide solution on the substrate having been mixed.

In an embodiment of the present disclosure, the path may further include a second path that allows the sulfuric acid to be supplied from the first tank to the nozzle therethrough without passing through the heating region. The substrate processing apparatus may further include a second valve that is placed in the second path. The controller may control supply of the sulfuric acid and the hydrogen peroxide solution to the nozzle by controlling opening and closing of the first valve, the second valve, and the hydrogen peroxide valve. The sulfuric acid passing through the second path may be mixed with the hydrogen peroxide solution at a temperature lower than a temperature of the sulfuric acid passing through the first path. After the sulfuric acid, which has passed through the first path and has been heated by the first heater, and the hydrogen peroxide solution are mixed and then ejected from the nozzle onto the substrate, the controller may control the first valve, the second valve, and the hydrogen peroxide valve so that the sulfuric acid, which passes through the second path, and the hydrogen peroxide solution are mixed and then ejected from the nozzle onto the substrate.

In an embodiment of the present disclosure, the substrate processing apparatus may further comprise a first junction and a second junction. The first junction may be placed between the heating region and an outlet of the nozzle, where the first path and the hydrogen peroxide supply path may meet. The second junction may be placed between the heating region and the first junction, where the first path and the second path may meet.

In an embodiment of the present disclosure, the first path and the second path may diverge on an upstream side of the heating region in a flow direction of the sulfuric acid, and meet on a downstream side of the heating region in the flow direction of the sulfuric acid.

In an embodiment of the present disclosure, the sulfuric acid passing through the first path may have a first temperature by the controller setting the first heater to a first output. The sulfuric acid passing through the first path may have a second temperature lower than the first temperature by the controller setting the first heater to a second output lower than the first output.

In an embodiment of the present disclosure, the path may further include a circulation pipe that diverges from the first path and that allows the sulfuric acid to return to the first tank therethrough. The first heater is located on an upstream side of a diverging point, from which the first path and the circulation pipe diverge, in a flow direction of the sulfuric acid.

In an embodiment of the present disclosure, the path may further include a circulation pipe that diverges from the first path and that allows the sulfuric acid to return to the first tank therethrough. The first heater may be located on a downstream side of a diverging point, from which the first path and the circulation pipe diverge, in a flow direction of the sulfuric acid.

In an embodiment of the present disclosure, the substrate processing apparatus may further comprise a second heater for maintaining a temperature of the sulfuric acid in the first tank at a predetermined temperature.

In an embodiment of the present disclosure, the substrate processing apparatus may further comprise a second tank and a third heater. The second tank may be located on a downstream side of the first tank in a flow direction of the sulfuric acid. The third heater may maintain a temperature of the sulfuric acid in the second tank at a temperature higher than a temperature of the sulfuric acid in the first tank.

A substrate processing method according to an aspect of the present disclosure processes a substrate by supplying a processing liquid to the substrate. The substrate processing method comprises: ejecting, as a first ejection, sulfuric acid and a hydrogen peroxide solution onto the substrate, the sulfuric acid having been supplied from a first tank, passed through a first path including a heating region, and been heated in the heating region, the hydrogen peroxide solution having passed through a hydrogen peroxide supply path; and ejecting, as a second ejection, sulfuric acid and a hydrogen peroxide solution onto the substrate after the first ejection, the sulfuric acid in the second ejection having a lower temperature than a temperature of the sulfuric acid supplied from the first tank and heated, the hydrogen peroxide solution in the second ejection having passed through the hydrogen peroxide supply path.

In an embodiment of the present disclosure, the second ejection may include ejecting the sulfuric acid that has passed through a second path without the heating region and the hydrogen peroxide solution onto the substrate.

In an embodiment of the present disclosure, the first path and the second path may diverge on an upstream side of the heating region in a flow direction of the sulfuric acid, and meet on a downstream side of the heating region in the flow direction of the sulfuric acid.

In an embodiment of the present disclosure, the substrate processing method may further include a first distribution before the first ejection and a second distribution before the second ejection. The first distribution includes heating the sulfuric acid passing through the first path to set a temperature of the sulfuric acid to a first temperature. The second distribution includes setting a temperature of the sulfuric acid passing through the first path to a second temperature lower than the first temperature.

In an embodiment of the present disclosure, a temperature of the sulfuric acid in the first tank may be maintained at a predetermined temperature.

In an embodiment of the present disclosure, a temperature of sulfuric acid in a second tank may be maintained at a temperature higher than the temperature of the sulfuric acid in the first tank. The second tank is located on a downstream side of the first tank in a flow direction of the sulfuric acid.

DETAILED DESCRIPTION

Figure 1:
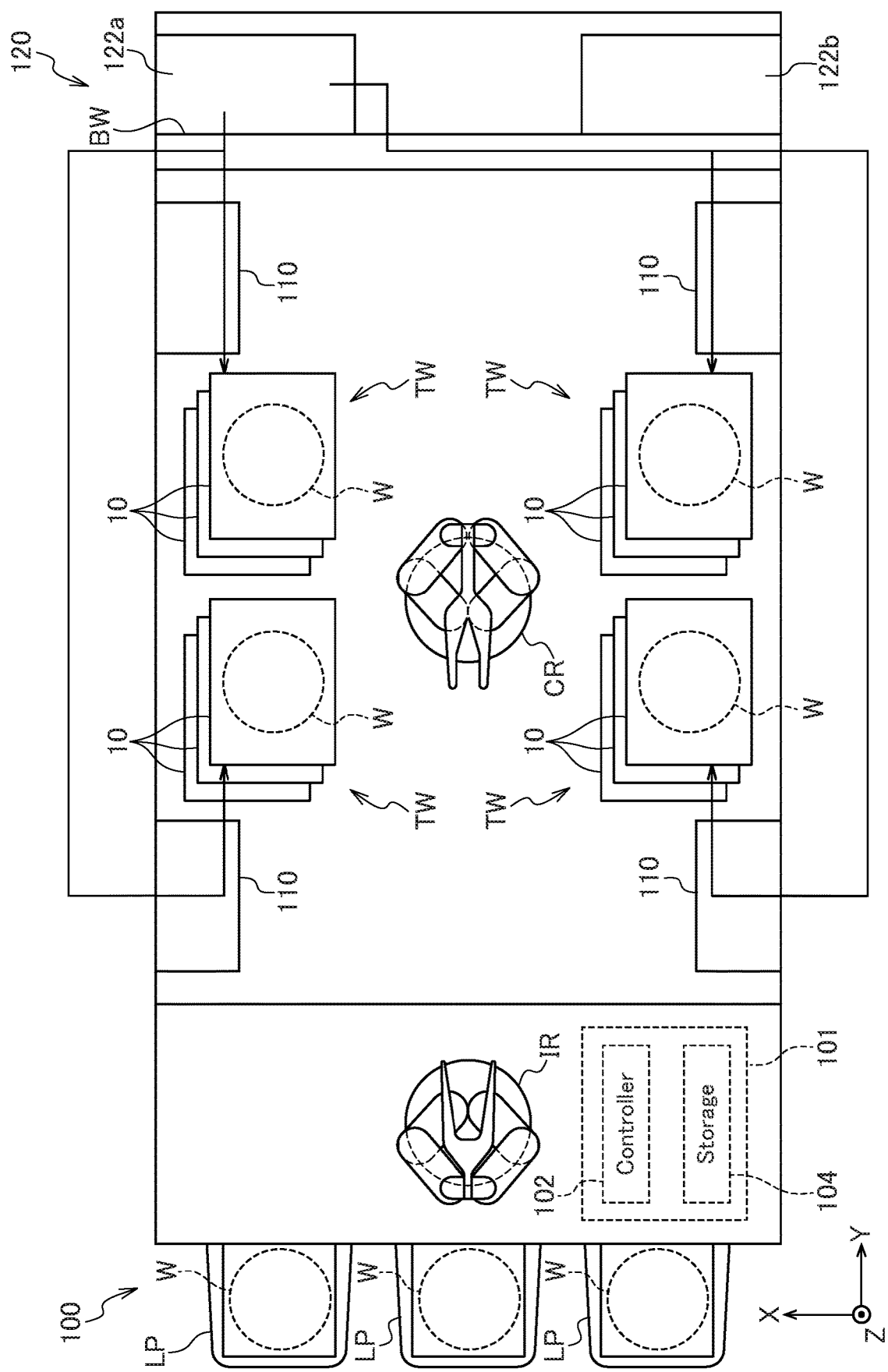
FIG. 1 is a schematic plan view of a substrate processing apparatus according to a first embodiment of the present disclosure.

Respective embodiments of a substrate processing method and a substrate processing apparatus according to the present disclosure will hereinafter be described with reference to the accompanying drawings. In the drawings, the same or corresponding elements are assigned the same reference signs, and descriptions thereof are not repeated. In the present specification, X-axis, Y-axis and Z-axis that are orthogonal to each other may be described to facilitate understanding of the present disclosure. Typically, the X-axis and Y-axis are parallel to a horizontal direction, and the Z-axis is parallel to a vertical direction.

First Embodiment

First, a substrate processing apparatus 100 according to a first embodiment of the present disclosure will be described with reference to FIG. 1. FIG. 1 is a schematic plan view of the substrate processing apparatus 100 according to the present embodiment.

The substrate processing apparatus 100 processes substrates W. The substrate processing apparatus 100 processes the substrates W by applying, to the substrates W, at least one of processes that include an etching process, a surface finishing process, a character imparting process, a processing film forming process, and a process for removing and cleaning at least part of a film.

The substrates W are employed as semiconductor substrates. Each of the substrates W includes a semiconductor wafer. For example, each substrate W has a substantially disk shape. Here, the substrate processing apparatus 100 processes the substrates W one by one.

As illustrated in FIG. 1, the substrate processing device 100 includes substrate processing units 10, processing liquid boxes 110, a processing liquid cabinet 120, load ports LP, an indexer robot IR, a center robot CR, and a control device 101. The control device 101 controls the load ports LP, the indexer robot IR, and the center robot CR. The control device 101 includes a controller 102 and storage 104.

Each of the load ports LP accommodates a plurality of substrates W in a stacked manner. The indexer robot IR conveys the substrates W between the load ports LP and the center robot CR. The center robot CR conveys the substrates W between the indexer robot IR and the substrate processing units 10. Each of the substrate processing units 10 ejects a processing liquid onto a substrate W to process the substrate W. The processing liquid cabinet 120 stores the processing liquid.

Specifically, the substrate processing units 10 form a plurality of towers TW (four towers TW in FIG. 1) with the towers surrounding the center robot CR in a plan view. Each tower TW includes a plurality of substrate processing units 10 (three substrate processing units 10 in FIG. 1) stacked one above the other. The processing liquid boxes 110 individually correspond to the towers TW. The processing liquid in the processing liquid cabinet 120 is supplied, via any one of the processing liquid boxes 110, to the tower TW corresponding to the processing liquid box 110. Note that gas may be supplied to the substrate processing units 10 and the processing liquid cabinet 120 in addition to the processing liquid.

The processing liquid may contain a so-called chemical liquid. The chemical liquid contains hydrofluoric acid. For example, hydrofluoric acid may be heated to 40° C. or higher and 70° C. or lower, or 50° C. or higher and 60° C. or lower. However, hydrofluoric acid does not have to be heated. The chemical liquid may also contain water or phosphoric acid.

The chemical liquid may further contain a hydrogen peroxide solution. The chemical liquid may also contain sulfuric acid or a sulfuric acid-hydrogen peroxide mixture. The chemical liquid may also include an ammonium hydrogen-peroxide mixture (SC1), hydrochloric acid hydrogen peroxide mixture (SC2), or a mixture of concentrated hydrochloric acid and concentrated nitric acid (aqua regia)

Alternatively, the processing liquid may contain a so-called rinse liquid. The rinse liquid may contain any of deionized water (DIW), carbonated water, electrolysis ionized water, ozonized water, ammonia water, hydrochloric acid having a diluted concentration (for example, about 10 ppm to 100 ppm), and reduced water (hydrogen water).

A specific space within the substrate processing apparatus 100 is defined by the processing liquid cabinet 120. In the substrate processing apparatus 100, a boundary wall BW is arranged between an area where the center robot CR and the substrate processing units 10 are installed and an area where the processing liquid cabinet 120 is installed. The processing liquid cabinet 120 defines part of the space outside the boundary wall BW within the substrate processing apparatus 100.

The processing liquid cabinet 120 partitions a specific space within the substrate processing apparatus 100 with a housing. The processing liquid cabinet 120 includes, within the housing, processing liquid pipes that allow a processing liquid to flow through. Typically, the processing liquid cabinet 120 also includes a preparation tank (tank) for preparing the processing liquid. The processing liquid cabinet 120 may include a preparation tank for one type of processing liquid, or may include a preparation tank for a plurality of types of processing liquids. The processing liquid cabinet 120 may also include a filter(s), a nozzle(s) and/or a pump(s) for distributing the processing liquids.

Here, the processing liquid cabinet 120 includes a first processing liquid housing 122a and a second processing liquid housing 122b. Note that although FIG. 1 illustrates a flow such that the processing liquid in the first processing liquid housing 122a is supplied, via one of the processing liquid boxes 110, to the tower TW corresponding to the processing liquid box 110, the flow of the processing liquid inside the second processing liquid housing 122b is omitted in order to avoid excessively complicating the drawing.

The control device 101 controls various operations of the substrate processing apparatus 100. The control device 101 includes the controller 102 and the storage 104. The controller 102 includes a processor. The controller 102 includes, for example, a central processing unit (CPU). Alternatively, the controller 102 may include a general-purpose computer.

The storage 104 stores data and a computer program. The data contains recipe data. The recipe data includes information indicating a plurality of recipes. Each recipe defines processing content and processing procedure of the substrates W.

The storage 104 includes main storage and auxiliary storage. The main storage is, for example a semiconductor memory. The auxiliary storage is, for example, a semiconductor memory and/or a hard disk drive. The storage 104 may include removable media. The controller 102 executes the computer program stored in the storage 104 to perform a substrate processing operation.

Figure 2:
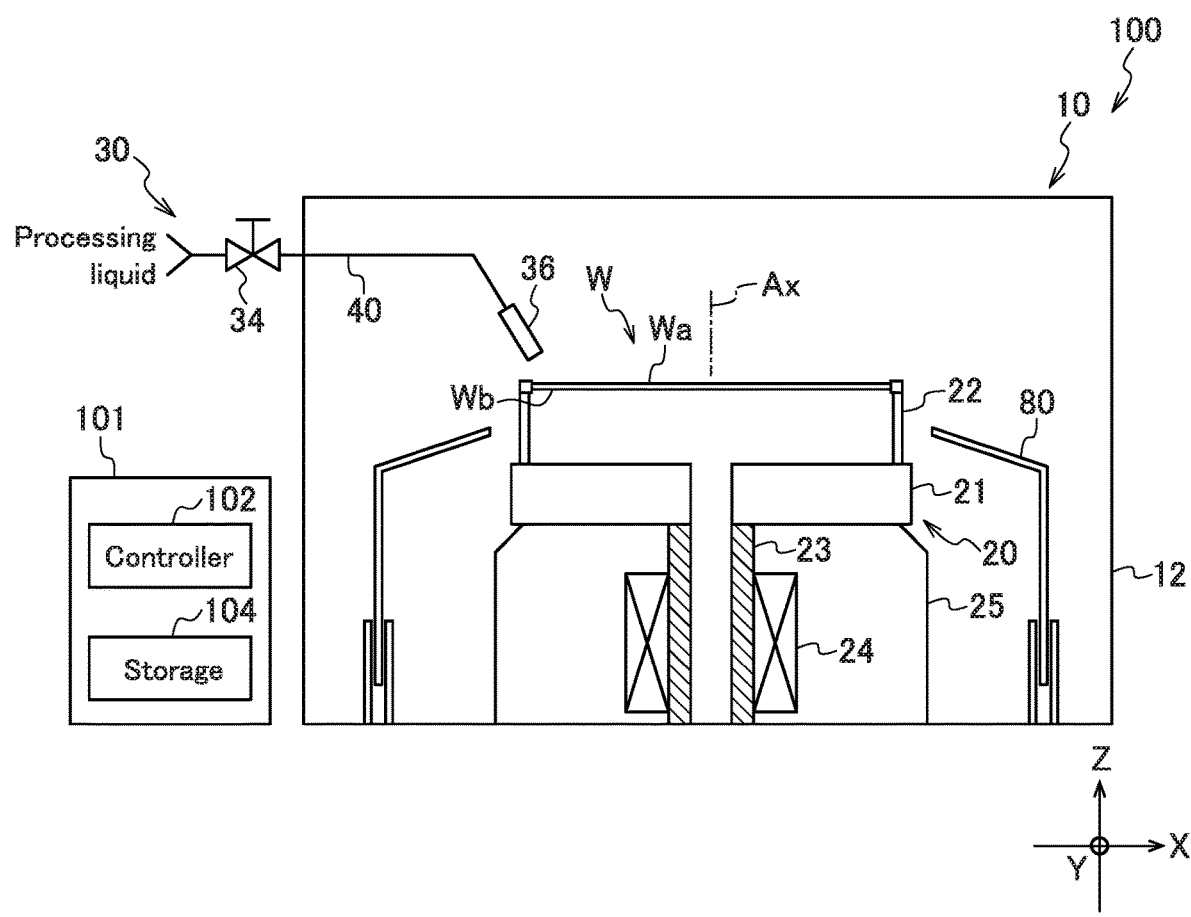
FIG. 2 is a schematic diagram of a substrate processing unit in the substrate processing apparatus according to the first embodiment.

Next, the substrate processing unit 10 in the substrate processing apparatus 100 according to the present embodiment will be described with reference to FIG. 2. FIG. 2 is a schematic view of the substrate processing unit 10 in the substrate processing apparatus 100.

The substrate processing unit 10 includes a chamber 12 and a substrate holding section 20. The chamber 12 stores a substrate W. The substrate holding section 20 holds the substrate W.

The chamber 12 has a substantially box shape with an internal space. The chamber 12 stores a substrate W. Here, the substrate processing apparatus 100 is a single-wafer type that processes substrates W one by one. The substrates W are stored one by one in the chamber 12. A substrate W is stored in the chamber 12 and then processed in the chamber 12. The chamber 12 stores at least part of each of sections that include the substrate holding section 20 and a processing liquid supply section 130 to be described later.

The substrate holding section 20 holds a substrate W. The substrate holding section 20 horizontally holds the substrate W with the upper surface (front surface) Wa and the lower surface (back surface) Wb of the substrate W faced upward and downward in the vertical direction, respectively. Further, the substrate holding section 20 rotates the substrate W with the substrate W held. The substrate holding section 20 rotates the substrate W while holding the substrate W.

For example, the substrate holding section 20 may be of a pinching type that pinches the end portion of the substrate W. Alternatively, the substrate holding section 20 may have an arbitrary mechanism that holds the substrate W from the back surface Wb. For example, the substrate holding section 20 may be of a vacuum type. In this case, the substrate holding section 20 holds the substrate W horizontally with the upper surface of the substrate holding section 20 adsorbing the central portion of the back surface Wb of the substrate W, which is a non-device forming surface. Alternatively, the substrate holding section 20 may be of a combination type of the vacuum type and the pinching type in which a plurality of chuck pins are brought into contact with the peripheral edge surface of the substrate W.

For example, the substrate holding section 20 includes a spin base 21, a chuck member 22, a shaft 23, an electric motor 24, and a housing 25. The chuck member 22 is provided on the spin base 21. The chuck member 22 chucks the substrate W. Typically, the spin base 21 is provided with a plurality of chuck members 22.

The shaft 23 is a hollow shaft. The shaft 23 extends in a vertical direction along an axis of rotation Ax thereof. The spin base 21 is coupled to the upper end of the shaft 23. The substrate W is placed above the spin base 21.

The spin base 21 has a disk shape and horizontally supports the substrate W. The shaft 23 extends downward from the central portion of the spin base 21. The electric motor 24 applies a rotational force to the shaft 23. The electric motor 24 rotates the shaft 23 in the rotation direction, thereby rotating the substrate W and the spin base 21 around the axis of rotation Ax. The housing 25 surrounds the shaft 23 and the electric motor 24.

The substrate processing apparatus 100 further includes the processing liquid supply section 30. The processing liquid supply section 30 supplies a processing liquid to the substrate W. Typically, the processing liquid supply section 30 supplies the processing liquid onto an upper surface Wa of the substrate W.

The processing liquid supply section 30 includes a pipe 40, a valve 34, a nozzle 36, and a heater 60 (see FIG. 3) to be described later. The nozzle 36 ejects a processing liquid onto the upper surface Wa of the substrate W. The nozzle 36 may, for example, eject the processing liquid onto the central portion of the substrate W, or may eject the processing liquid onto a region between the central portion and the peripheral portion of the substrate W. The nozzle 36 includes an outlet 36a (see FIG. 3), and ejects the processing liquid from the outlet 36a. The nozzle 36 is connected to the pipe 40. The pipe 40 is supplied with a processing liquid from a supply source. The valve 34 opens and closes the flow path in the pipe 40. Preferably, the nozzle 36 is configured to be movable relative to the substrate W. The nozzle 36 is movable in the horizontal direction and/or the vertical direction according to a movement mechanism to be controlled by the controller 102. It should be noted that the moving mechanism is omitted in the present specification to avoid over-complicating the drawings.

The valve 34 adjusts the opening degree of the pipe 40 to adjust the flow rate of the processing liquid to be supplied to the pipe 40. Specifically, the valve 34 includes a valve body (not illustrated) in which a valve seat is provided, a valving element that opens and closes the valve seat, and an actuator (not illustrated) that moves the valving element between an open position and a closed position.

The substrate processing apparatus 100 further includes a cup 80. The cup 80 collects the processing liquid scattered from the substrate W. The cup 80 moves up and down. For example, the cup 80 keeps a vertically risen state up to the side of the substrate W while the processing liquid supply section 30 supplies the processing liquid to the substrate W. In this case, the cup 80 collects the processing liquid scattered from the substrate W due to the rotation of the substrate W. The cup 80 also descends vertically downward from the side of the substrate W when the period during which the processing liquid supply section 30 supplies the processing liquid to the substrate W ends.

As described above, the control device 101 includes the controller 102 and the storage 104. The controller 102 controls the substrate holding section 20, the processing liquid supply section 30, and/or the cup 80. In one example, the controller 102 controls the electric motor 24 and the valve 34.

The substrate processing apparatus 100 according to the present embodiment is suitably used for manufacturing semiconductor devices including semiconductors. Typically, in a semiconductor device, a conductive layer and an insulating layer are laminated on a base member. The substrate processing apparatus 100 is suitably used for cleaning and/or processing (for example, etching, characteristic change) the conductive layer and/or the insulating layer when the semiconductor device is manufactured. The substrate processing apparatus 100 is also suitably used for removing an insulating layer (for example, a resist layer).

Note that although the processing liquid supply section 30 can supply the substrate W with one type of processing liquid in the substrate processing unit 10 illustrated in FIG. 2, the processing liquid supply section 30 may be capable of supplying a plurality of types of processing liquids to the substrate W. For example, the processing liquid supply section 30 may include multiple pipes 40, valves 34 and nozzles 36.

Figure 3:
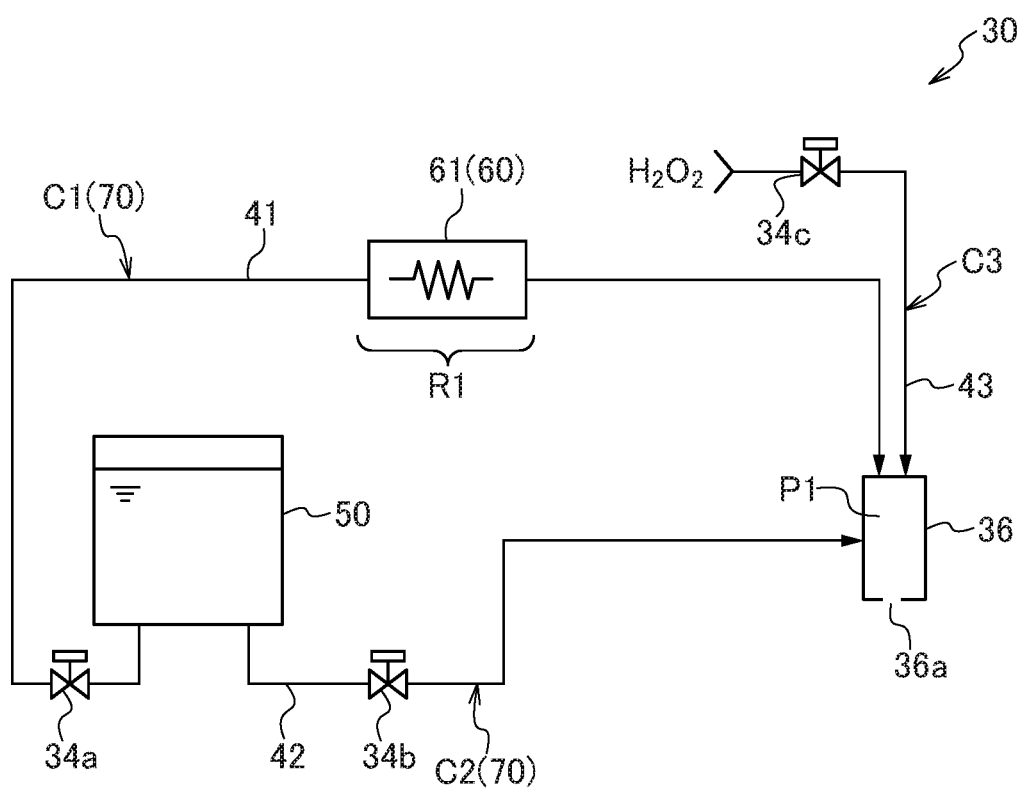
FIG. 3 is a schematic diagram of a processing liquid supply section of the substrate processing apparatus according to the first embodiment.

Next, the substrate processing apparatus 100 according to the present embodiment will be described in detail with reference to FIGS. 1 to 3. FIG. 3 is a schematic diagram of the processing liquid supply section 30 in the substrate processing apparatus 100 according to the present embodiment.

The processing liquid supply section 30 includes a tank 50, a path 70, a hydrogen peroxide supply path C3, and a heater 61 as the heater 60 described above, as illustrated in FIG. 3. The tank 50 stores sulfuric acid. The path 70 allows the sulfuric acid to be supplied therethrough from the tank 50 to the nozzle 36. In the present embodiment, the path 70 includes a first path C1 and a second path C2. Note that the tank 50 is an example of the "first tank" in the present disclosure. The heater 61 is an example of the "first heater" in the present disclosure.

The first path C1 allows the sulfuric acid to be supplied therethrough from the tank 50 to the nozzle 36. The heater 61 heats a heating region R1 of the first path C1. Accordingly, the temperature of the sulfuric acid passing through the heating region R1 rises. The sulfuric acid passing through the heating region R1 reaches, for example, 170° C. to 190° C. or higher. Although a heater other than the heater 61 may be arranged in the first path C1, the heater 61 is located on the most downstream side of the first path C1 in the flow direction of the sulfuric acid.

The second path C2 allows the sulfuric acid to be supplied therethrough from the tank 50 to the nozzle 36 without going through the heating region R1. Note that no heater is arranged in the second path C2 in the present embodiment. The temperature of the sulfuric acid that has passed through the second pass C2 is lower than the temperature of the sulfuric acid that has been heated while passing through the first path C1.

The hydrogen peroxide supply path C3 allows the hydrogen peroxide solution to be supplied therethrough to the nozzle 36. For example, the hydrogen peroxide supply path C3 allows the hydrogen peroxide solution to be supplied therethrough from a hydrogen peroxide solution tank (not illustrated) to the nozzle 36. Note that the temperature of the hydrogen peroxide solution passing through the hydrogen peroxide supply path C3 is equal to room temperature (for example, 25° C.) because no heater is arranged in the hydrogen peroxide supply path C3.

The processing liquid supply section 30 includes, as the pipe 40 described above, a first pipe 41, a second pipe 42, and a third pipe 43. In the present embodiment, the first path C1 is configured by the first pipe 41. The second path C2 is configured by the second pipe 42. The hydrogen peroxide supply path C3 is configured by the third pipe 43.

The processing liquid supply section 30 includes, as the valve 34 described above, a first valve 34a, a second valve 34b, and a hydrogen peroxide valve 34c. The first valve 34a is placed in the first path C1, and opens and closes the flow path of the first path C1. The second valve 34b is placed in the second path C2, and opens and closes the flow path of the second path C2. The hydrogen peroxide valve 34c is placed in the hydrogen peroxide supply path C3, and opens and closes the flow path of the hydrogen peroxide supply path C3.

In the present embodiment, the sulfuric acid passing through the first path C1 is mixed with the hydrogen peroxide solution passing through the hydrogen peroxide supply path C3 at a first junction P1. The first junction P1 is arranged between the heating region R1 and the outlet 36a of the nozzle 36, at which the first path C1 and the hydrogen peroxide supply path C3 meet. In the present embodiment, the first junction P1 is placed inside the nozzle 36, for example.

The mixing ratio of the hydrogen peroxide solution and the sulfuric acid passing through the first path C1 is set so that the concentration of the sulfuric acid is greater than that in the case of 8:2 volume ratio of sulfuric acid to hydrogen peroxide solution. The mixing ratio of the hydrogen peroxide solution and the sulfuric acid passing through the first path C1 is also set so that the volume ratio of sulfuric acid to hydrogen peroxide solution becomes 8.5 to 9.5:1.5 to 0.5. The mixed sulfuric acid and hydrogen peroxide solution react with each other to form a high-temperature (for example, 200° C. or higher) hydrogen peroxide mixture.

The sulfuric acid passing through the second path C2 and the hydrogen peroxide solution passing through the hydrogen peroxide supply path C3 are mixed, for example within the nozzle 36. The sulfuric acid passing through the second path C2 is mixed with the hydrogen peroxide solution at a temperature lower than that of the sulfuric acid passing through the first path C1. That is, although the sulfuric acid and the hydrogen peroxide solution to be mixed react with each other, they form a relatively low-temperature hydrogen peroxide mixture. In the present embodiment, the flow rate (amount of flow per unit time) of sulfuric acid passing through the second path C2 is, but not particularly limited to, substantially the same as the flow rate of sulfuric acid passing through the first path C1.

The controller 102 controls the first valve 34a, the second valve 34b, and the hydrogen peroxide valve 34c so that the hydrogen peroxide solution and the sulfuric acid passing through the second path C2 are mixed and then ejected from the nozzle 36 onto the substrate W after the hydrogen peroxide solution and the sulfuric acid passing through the first path C1 are mixed and then ejected from the nozzle 36 onto the substrate W. It is therefore possible to prevent the high-temperature sulfuric acid-hydrogen peroxide mixture from becoming higher in temperature when the supply of the sulfuric acid is stopped in order to rinse away the sulfuric acid-hydrogen peroxide mixture on the substrate W with a hydrogen peroxide solution. A sudden change in the temperature of the substrate W can also be suppressed. As a result, damage to the substrate W such as pattern peeling on the substrate W can be suppressed.

Specifically, when the hydrogen peroxide solution and the sulfuric acid passing through the first path C1 are mixed, the hydrogen peroxide solution and the sulfuric acid to be mixed react with each other to form a high-temperature (for example, 200° C. or higher) sulfuric acid-hydrogen peroxide mixture. When the supply of the sulfuric acid is stopped after the high-temperature sulfuric acid-hydrogen peroxide mixture is ejected onto the substrate W, the high-temperature sulfuric acid-hydrogen peroxide mixture and the hydrogen peroxide solution are mixed on the substrate W. At this time, the sulfuric acid-hydrogen peroxide mixture remaining on the substrate W is high in temperature and therefore reacts violently with the hydrogen peroxide solution, and is heated to a higher temperature, and the substrate W is also heated to a high temperature. The sulfuric acid-hydrogen peroxide mixture is removed from the substrate W by the hydrogen peroxide solution further supplied onto the substrate W, while the temperature of the substrate W rapidly drops due to the supplied hydrogen peroxide solution.

In the present embodiment, the hydrogen peroxide solution and the sulfuric acid passing through the first path C1 are mixed and then ejected from the nozzle 36 onto the substrate W. Subsequently, the hydrogen peroxide solution and the sulfuric acid passing through the second path C2 are mixed and then ejected from the nozzle 36 onto the substrate W. The sulfuric acid passing through the second path C2 is mixed with the hydrogen peroxide solution at a temperature lower than that of the sulfuric acid passing through the first path C1. Therefore, the hydrogen peroxide solution and the sulfuric acid to be mixed react with each other, and form a relatively low-temperature sulfuric acid-hydrogen peroxide mixture. When the supply of the sulfuric acid is stopped after the relatively low-temperature sulfuric acid-hydrogen peroxide mixture is ejected onto the substrate W, the relatively low-temperature sulfuric acid-hydrogen peroxide mixture is mixed with the hydrogen peroxide solution on the substrate W. At this time, the sulfuric acid-hydrogen peroxide mixture remaining on the substrate W is relatively low in temperature, and therefore suppressed from reacting violently with the hydrogen peroxide solution. As a result, the temperature of the sulfuric acid-hydrogen peroxide mixture is suppressed from becoming high, and the temperature rise of the substrate W is also suppressed. Subsequently, the hydrogen peroxide solution is further supplied onto the substrate W, so that the sulfuric acid-hydrogen peroxide mixture is removed from the substrate W, while the temperature of the substrate W decreases relatively slowly by the supplied hydrogen peroxide solution.

In the present embodiment, it is not necessary to adjust the mixing ratio of sulfuric acid and hydrogen peroxide solution to a desired ratio in order to suppress damage to the substrate W. Time can therefore be shortened compared to the method of adjusting the mixing ratio to the desired ratio.

In the present embodiment, providing the second path C2 enables the sulfuric acid to be supplied from the tank 50 to the nozzle 36 without going through the heating region R1. As a result, the hydrogen peroxide solution can be easily mixed with the sulfuric acid having a temperature lower than that of the sulfuric acid heated while going through the first path C1.

Figure 4:
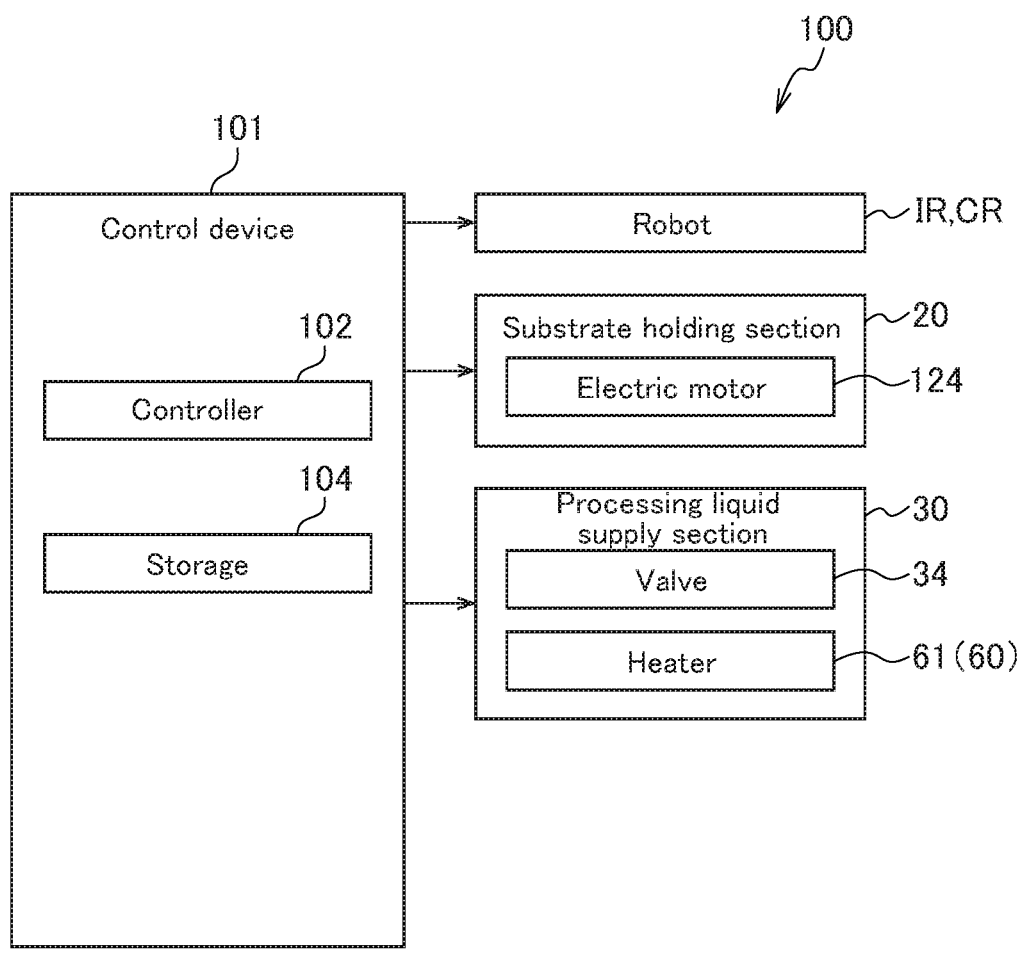
FIG. 4 is a block diagram of the substrate processing apparatus according to the first embodiment.

Next, the substrate processing apparatus 100 according to the present embodiment will be described with reference to FIGS. 1 to 4. FIG. 4 is a block diagram of the substrate processing apparatus 100.

As illustrated in FIG. 4, the control device 101 controls various operations of the substrate processing apparatus 100. The control device 101 controls the indexer robot IR, the center robot CR, the substrate holding section 20, and the processing liquid supply section 30. Specifically, the control device 101 transmits control signals to the indexer robot IR, the center robot CR, the substrate holding section 20, and the processing liquid supply section 30, thereby controlling the indexer robot IR, the center robot CR, the substrate holding section 20, and the processing liquid supply section 30.

Specifically, the controller 102 controls the indexer robot IR and then transfers the substrate W through the indexer robot IR.

The controller 102 controls the center robot CR and then transfers the substrate W through the center robot CR. For example, the center robot CR receives an unprocessed substrate W and loads the substrate W into one of the substrate processing units 10. The center robot CR also receives the processed substrate W from the substrate processing unit 10 and unloads the substrate W.

The controller 102 controls the substrate holding section 20, thereby controlling the start of rotation of the substrate W, change of the rotation speed, and stop of rotation of the substrate W. For example, the controller 102 controls the substrate holding section 20, and changes the number of rotations of the substrate holding section 20. Specifically, the controller 102 changes the number of rotations of the substrate W by changing the number of rotations of the electric motor 24 in the substrate holding section 20.

The controller 102 controls the valve 34 of the processing liquid supply section 30 and then switches the state of the valve 34 between an open state and a closed state. Specifically, the controller 102 controls the valve 34 of the processing liquid supply section 30 and then opens the valve 34, thereby allowing the processing liquid or the like to flow through the pipe 40 toward the nozzle 36. The controller 102 also controls the valve 34 of the processing liquid supply section 30 and then closes the valve 34, thereby stopping the supply of the processing liquid or the like toward the nozzle 36 through the pipe 40. That is, the controller 102 controls the supply of sulfuric acid and hydrogen peroxide solution to the nozzle 36 by controlling the opening and closing of the first valve 34a, the second valve 34b, and the hydrogen peroxide valve 34c, for example.

The controller 102 controls the heater 60 and then heats the tank 50 and the pipe 40 to a predetermined temperature. Specifically, the controller 102 controls the on/off of the heater 60 to maintain a target temperature near a predetermined temperature. Here, the target temperature is at least one of temperatures that include the temperature of the sulfuric acid within the tank 50 and the temperature of the sulfuric acid passing through the pipe 40. In the present embodiment, the controller 102 controls the heater 60, thereby heating the sulfuric acid passing through the heating region R1 in the first path C1 to a predetermined temperature.

Figure 5:
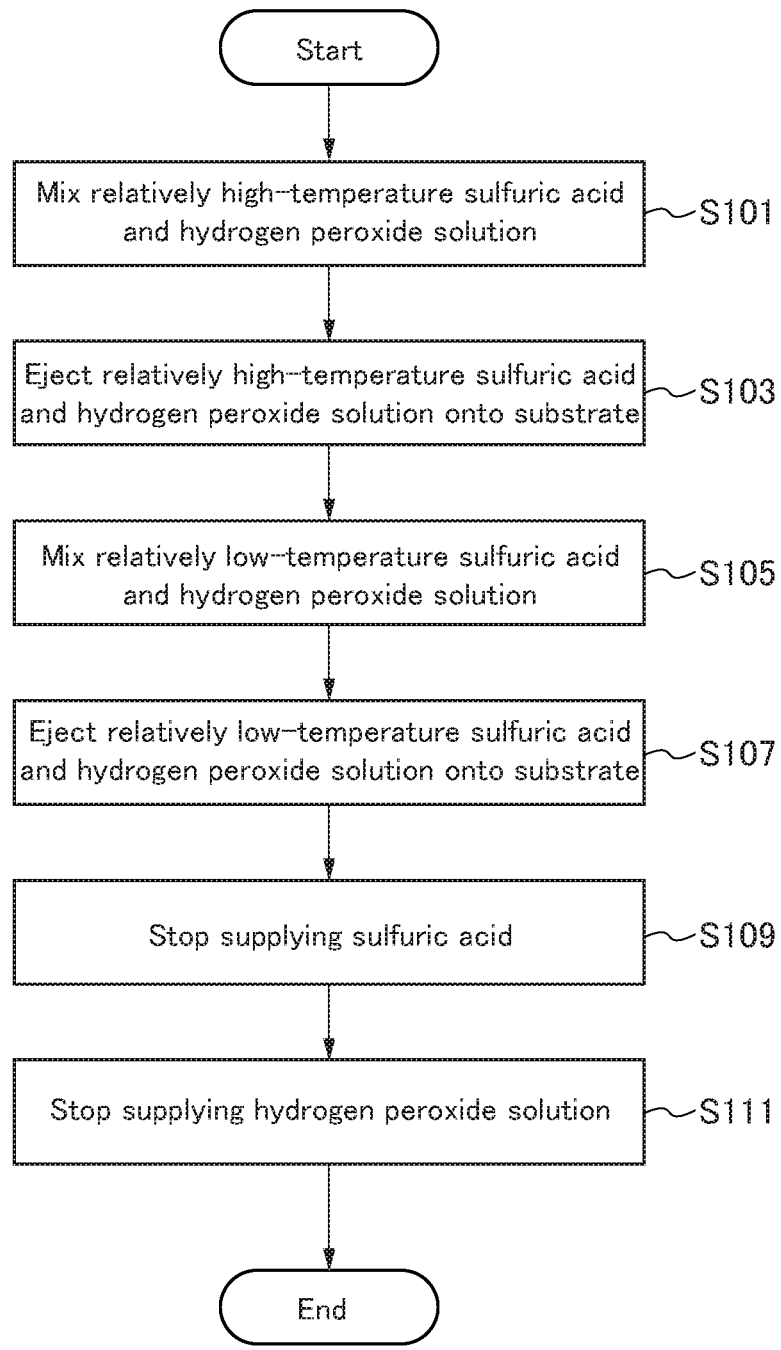
FIG. 5 is a flowchart of a substrate processing method by the substrate processing apparatus according to the first embodiment.

Next, a substrate processing method by the substrate processing apparatus 100 according to the present embodiment will be described with reference to FIGS. 1 to 5. FIG. 5 is a flowchart of the substrate processing method by the substrate processing apparatus 100 according to the present embodiment. Note that Step S103 is an example of the "first ejection" of the present disclosure. Step S107 is an example of the "second ejection" of the present disclosure.

In Step S101 as illustrated in FIG. 5, the controller 102 causes the sulfuric acid that has passed through the heating region R1 to mix with the hydrogen peroxide solution. At this time, the second valve 34b is closed. The heater 61 is also turned on. Hereinafter, the sulfuric acid that has passed through the heating region R1 may be referred to as relatively high-temperature sulfuric acid.

Specifically, the controller 102 switches the first valve 34a from the closed state to the open state. The controller 102 also switches the hydrogen peroxide valve 34c from the closed state to the open state. The sulfuric acid is accordingly supplied from the tank 50 toward the nozzle 36. The sulfuric acid is heated to a predetermined temperature (for example, 170° C. to 190° C. or higher) with the heater 61 in the heating region R1 of the first pipe 41. The hydrogen peroxide solution is also supplied toward the nozzle 36.

The relatively high-temperature sulfuric acid heated in the heating region R1 is mixed with the hydrogen peroxide solution. The relatively high-temperature sulfuric acid is mixed with the hydrogen peroxide solution between the heating region R1 and the outlet 36a of the nozzle 36. In the present embodiment, the relatively high-temperature sulfuric acid is mixed with the hydrogen peroxide solution within the nozzle 36. Note that the hydrogen peroxide valve 34c may be opened before the first valve 34a is opened.

The relatively high-temperature sulfuric acid and the hydrogen peroxide solution are then ejected onto the substrate W in Step S103. Specifically, a high-temperature (for example, 200° C. or higher) sulfuric acid-hydrogen peroxide mixture containing the relatively high-temperature sulfuric acid and the hydrogen peroxide solution is ejected from the outlet 36a of the nozzle 36 onto the substrate W for a predetermined period of time. As a result, for example, a predetermined region of a resist layer (not illustrated) of the substrate W is etched.

The controller 102 then mixes the relatively low-temperature sulfuric acid with the hydrogen peroxide solution in Step S105. Specifically, the controller 102 switches the second valve 34b from the closed state to the open state. The controller 102 also switches the first valve 34a from the open state to the closed state. As a result, the relatively low-temperature sulfuric acid is supplied from the tank 50 toward the nozzle 36. The supply of the relatively high-temperature sulfuric acid is stopped.

Note that the timing of switching the second valve 34b from the closed state to the open state is preferably performed before switching the first valve 34a from the open state to the closed state. Specifically, the second valve 34b is preferably switched from the closed state to the open state such that the relatively low-temperature sulfuric acid reaches the first junction P1 in a state where the relatively high-temperature sulfuric acid is present in the first junction P1 within the nozzle 36. As a result, it is possible to prevent only the hydrogen peroxide solution from being supplied from the nozzle 36 to the high-temperature sulfuric acid-hydrogen peroxide mixture on the substrate W.

In Step S107, the relatively low-temperature sulfuric acid and the hydrogen peroxide solution are then ejected onto the substrate W. Specifically, a relatively low-temperature sulfuric acid-hydrogen peroxide mixture containing the relatively low-temperature sulfuric acid and the hydrogen peroxide solution is ejected from the outlet 36a of the nozzle 36 onto the substrate W for a predetermined period of time.

In Step S109, the controller 102 then stops supplying the sulfuric acid. Specifically, the controller 102 switches the second valve 34b from the open state to the closed state. Only the hydrogen peroxide solution is accordingly supplied onto the substrate W. At this time, the hydrogen peroxide solution is mixed with the relatively low-temperature sulfuric acid-hydrogen peroxide mixture remaining on the substrate W, thereby suppressing a violent reaction between the sulfuric acid-hydrogen peroxide mixture and the hydrogen peroxide solution. Therefore, the temperature of the sulfuric acid-hydrogen peroxide mixture is suppressed from becoming high, and the temperature rise of the substrate W is also suppressed. The hydrogen peroxide solution is then further supplied onto the substrate W, whereby the sulfuric acid-hydrogen peroxide mixture is removed from the substrate W and the temperature of the substrate W decreases relatively slowly.

In Step S111, the controller 102 then stops supplying the hydrogen peroxide solution. Specifically, the controller 102 switches the hydrogen peroxide valve 34c from the open state to the closed state. As a result, the supply of the processing liquid to the substrate W is stopped.

As described above, the substrate processing method according to the present embodiment is completed.

(First Variation)

Figure 6:
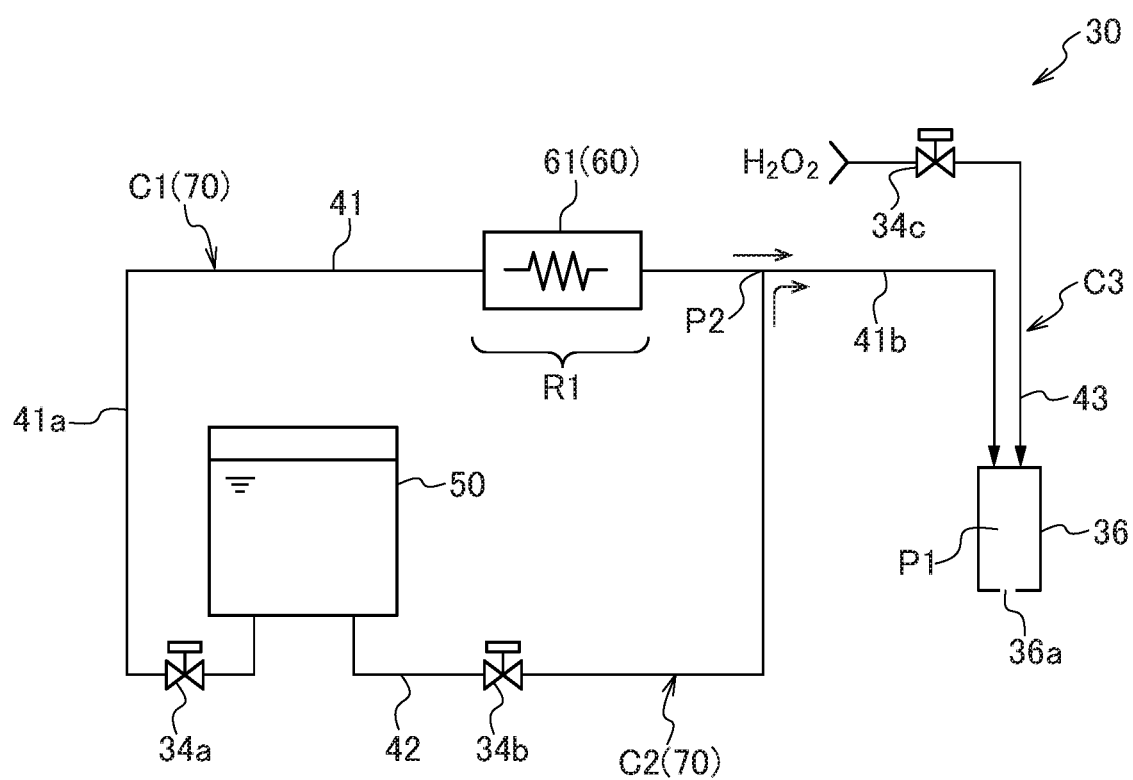
FIG. 6 is a schematic diagram of a processing liquid supply section of a substrate processing apparatus in a first variation.

Next, a substrate processing apparatus 100 in a first variation of the present disclosure will be described with reference to FIG. 6. In an example to be described in the first variation, a first path C1 and a second path C2 meet on the upstream side of a first junction P1 in the flow direction of sulfuric acid, unlike the first embodiment described with reference to FIGS. 1 to 5. FIG. 6 is a schematic diagram of a processing liquid supply section 30 of the substrate processing apparatus 100 in the first variation.

In the first variation as illustrated in FIG. 6, the processing liquid supply section 30 includes a second junction P2. The second junction P2 is a portion where the first path C1 and the second path C2 meet. The second junction P2 is arranged between the first junction P1 and a heating region R1, where the first path C1 and the second path C2 meet.

Specifically, part, of a first pipe 41, on the upstream side (tank 50 side) of the heating region R1 is defined as a pipe 41a. Part, of the first pipe 41, on the downstream side (nozzle 36 side) of the heating region R1 is defined as a pipe 41b. In this case, the second pipe 42 is connected to the pipe 41b. Part, of the pipe 41b, on the downstream side (nozzle 36 side) of the second junction P2 is a common path for the first path C1 and the second path C2. In the first variation, the second path C2 is configured by the second pipe 42 and part of the pipe 41b. A relatively low-temperature sulfuric acid is to be supplied to a nozzle 36 through the second pipe 42 and the part of the pipe 41b.

In the first variation, the first path C1 and the second path C2 meet between the first junction P1 and the heating region R1. Both the relatively high temperature sulfuric acid and the relatively low temperature sulfuric acid are therefore mixed with a hydrogen peroxide solution at the same position. It is therefore possible to stably mix the sulfuric acid and the hydrogen peroxide solution.

Since part of the pipe 41b can serve as a common pipe for the first path C1 and the second path C2, it is possible to suppress the processing liquid supply section 30 from increasing in size.

Other structures, other effects, and substrate processing methods in the first variation are the same as those in the first embodiment.

(Second Variation)

Figure 7:
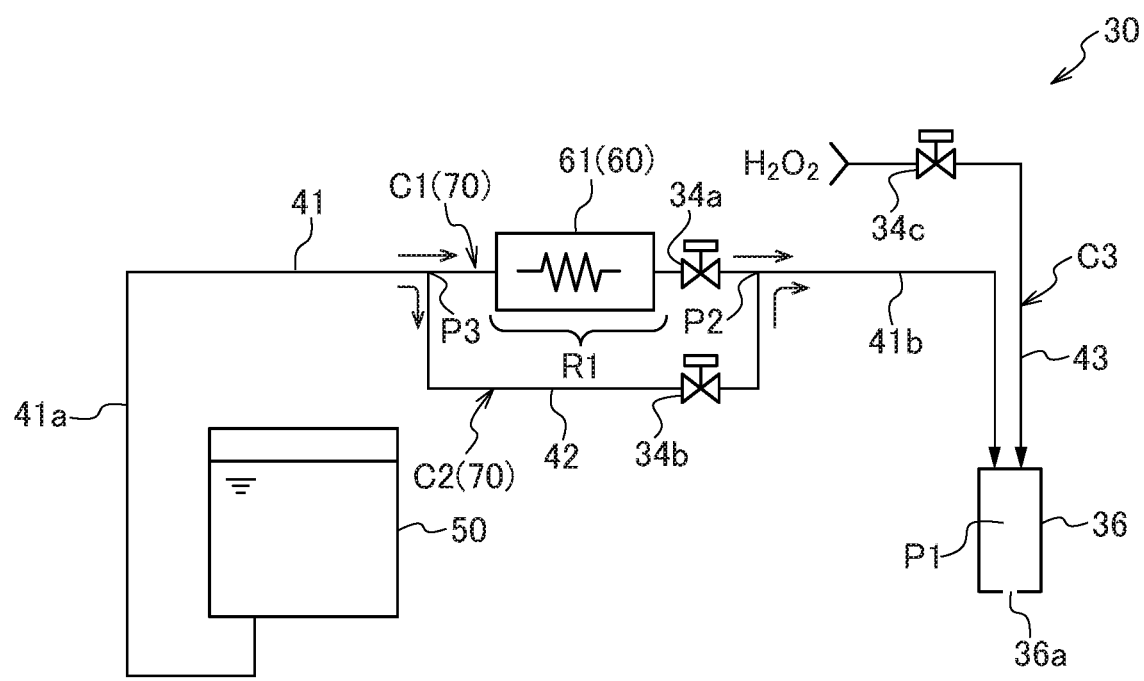
FIG. 7 is a schematic diagram of a processing liquid supply section of a substrate processing apparatus in a second variation.

Next, a substrate processing apparatus 100 in a second variation of the present disclosure will be described with reference to FIG. 7. In an example to be described in the second variation, a first path C1 and a second path C2 diverge on the upstream side of a heating region R1 in the flow direction of sulfuric acid, unlike the first variation described with reference to FIG. 6. FIG. 7 is a schematic diagram of a processing liquid supply section 30 of the substrate processing apparatus 100 in the second variation.

In the second variation as illustrated in FIG. 7, the processing liquid supply section 30 includes a diverging point P3. The first path C1 and the second path C2 diverge at the diverging point P3. The diverging point P3 is located on the upstream side (tank 50 side) of the heating region R1 in the flow direction of sulfuric acid. In other words, the first path C1 and the second path C2 diverge on the upstream side of the heating region R1 in the flow direction of sulfuric acid.

In the second variation, the first path C1 and the second path C2 meet on the downstream side (nozzle 36 side) of the heating region R1 in the flow direction of sulfuric acid. Specifically, the processing liquid supply section 30 includes a second junction P2 where the first path C1 and the second path C2 meet, like the first variation. The second junction P2 is located on the downstream side of the heating region R1 in the flow direction of sulfuric acid.

Specifically, a second pipe 42 is connected to pipes 41a and 41b of a first pipe 41. Part, of the pipe 41a, on the upstream side (tank 50 side) of the diverging point P3 serves as a common path for the first path C1 and the second path C2. In the second variation, the second path C2 is configured by part of the pipe 41a, the second pipe 42, and part of the pipe 41b. A relatively low-temperature sulfuric acid is to be supplied to a nozzle 36 through the part of the pipe 41a, the second pipe 42, and the part of the pipe 41b.

In the second variation, a first valve 34a that opens and closes the flow path of the first path C1 is arranged between the diverging point P3 and the second junction P2. A second valve 34b that opens and closes the flow path of the second path C2 is arranged in the second pipe 42.

In the second variation, the first path C1 and the second path C2 diverge on the upstream side of the heating region R1 and meet on the downstream side of the heating region R1. Since the part of the pipe 41a and the part of the pipe 41b can serve as a common pipe for the first path C1 and the second path C2, it is possible to suppress the processing liquid supply section 30 from increasing in size.

Other structures, other effects, and substrate processing methods in the second variation are the same as those in the first variation.

(Third Variation)

Figure 8:
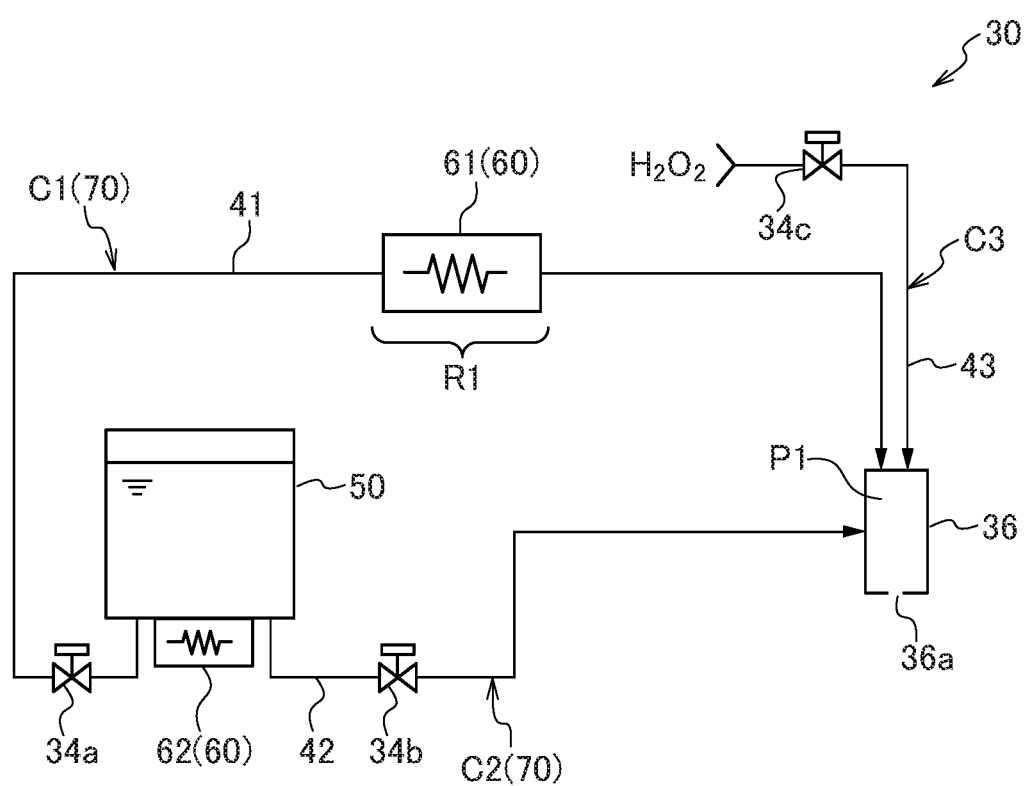
FIG. 8 is a schematic diagram of a processing liquid supply section of a substrate processing apparatus in a third variation.

Next, a substrate processing apparatus 100 in a third variation of the present disclosure will be described with reference to FIG. 8. In an example to be described in the third variation, a processing liquid supply section 30 includes a heater 62, unlike the first embodiment described with reference to FIGS. 1 to 5. FIG. 8 is a schematic diagram of the processing liquid supply section 30 of the substrate processing apparatus 100 in the third variation.

In the third variation as illustrated in FIG. 8, the processing liquid supply section 30 further includes a heater 62 as the heater 60 described above. Note that the heater 62 is an example of the "second heater" in the present disclosure. The heater 62 is a heater for maintaining sulfuric acid in a tank 50 near a predetermined temperature. In the third variation, the heater 62 maintains the temperature of the sulfuric acid in the tank 50 near a predetermined temperature by heating the tank 50. The temperature of the sulfuric acid in tank 50 is maintained in a range of 150° C. or higher. Note that the heater 62 does not have to heat the tank 50. For example, a circulation pipe for circulating the sulfuric acid may be connected to the tank 50 with the circulation pipe heated with the heater 62.

In the third variation, it is possible easily heat the sulfuric acid passing through a heating region R1 near a desired temperature (for example, 170° C. to 190° C. or higher) by providing the heater 62 for maintaining the sulfuric acid in the tank 50 near a predetermined temperature.

Other structures, other effects, and substrate processing methods in the third variation are the same as those in the first embodiment.

(Fourth Variation)

Figure 9:
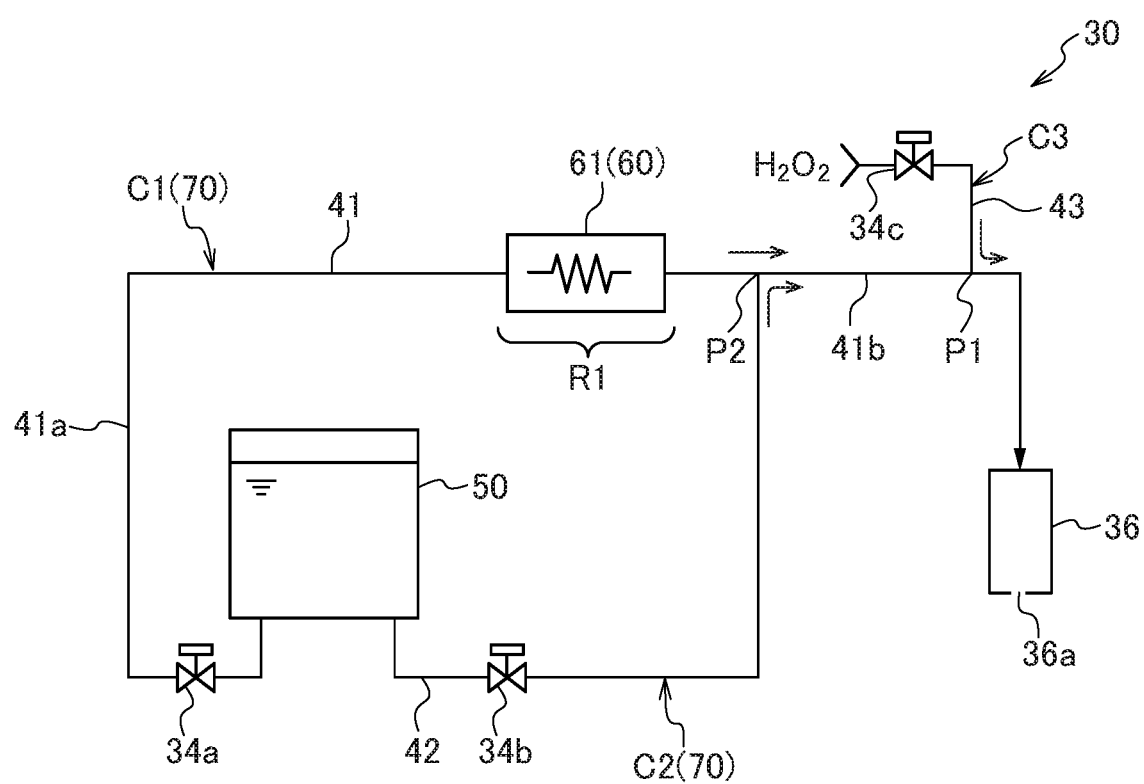
FIG. 9 is a schematic diagram of a processing liquid supply section of a substrate processing apparatus in a fourth variation.

Next, a substrate processing apparatus 100 in a fourth variation of the present disclosure will be described with reference to FIG. 9. In an example to be described in the second variation, a third pipe 43 is connected to a first pipe 41, unlike the first variation described with reference to FIG. 6. FIG. 9 is a schematic diagram of a processing liquid supply section 30 of the substrate processing apparatus 100 in the fourth variation.

In the fourth variation as illustrated in FIG. 9, a first path C1 and a hydrogen peroxide supply path C3 meet between a nozzle 36 and a heating region R1.

Specifically, the third pipe 43 is connected to a pipe 41b of the first pipe 41. The hydrogen peroxide supply path C3 is configured by the third pipe 43 and part of the pipe 41b.

In the fourth variation, the third pipe 43 is connected to the pipe 41b between a second junction P2 and the nozzle 36. Part, of the pipe 41b, on the downstream side (nozzle 36 side) of the first junction P1 serves as a common pipe for the first path C1, a second path C2, and the hydrogen peroxide supply path C3.

In the fourth variation, the part of the first pipe 41 can serve as a common pipe by connecting the third pipe 43 to the first pipe 41. It is therefore possible to suppress the processing liquid supply section 30 from increasing in size. Compared to the case where sulfuric acid and a hydrogen peroxide solution are mixed in the nozzle 36, the time from when the both are mixed to when the both are ejected is longer. It is therefore possible to uniformly mix the sulfuric acid and the hydrogen peroxide solution.

Other structures, other effects, and substrate processing methods in the fourth variation are the same as those in the first embodiment.

Second Embodiment

Figure 10:
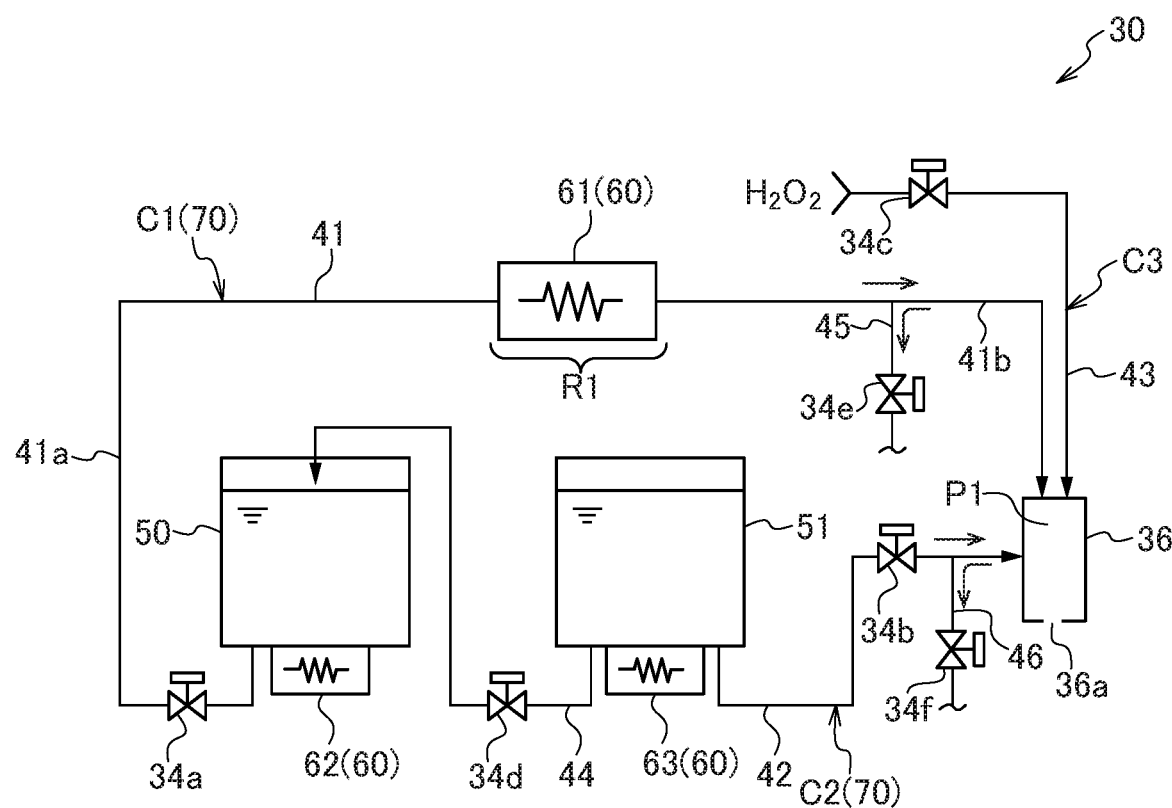
FIG. 10 is a schematic diagram of a processing liquid supply section of a substrate processing apparatus according to a second embodiment of the present disclosure.

Next, a substrate processing apparatus 100 according to a second embodiment of the present disclosure will be described with reference to FIG. 10. In an example to be described in the second embodiment, a processing liquid supply section 30 includes a tank 50 and a tank 51, unlike the first embodiment described with reference to FIGS. 1 to 5. FIG. 10 is a schematic diagram of the processing liquid supply section 30 in the substrate processing apparatus 100 according to the present embodiment. Different points from those of the first embodiment will be mainly described below.

In the second embodiment as illustrated in FIG. 10, the processing liquid supply section 30 includes the tanks 50 and 51, a path 70 (first path C1 and second path C2), a hydrogen peroxide supply path C3, and heaters 61, 62 and 63. The tanks 50 and 51 store sulfuric acid. The pass 70 allows the sulfuric acid to be supplied therethrough from the tank 51 to a nozzle 36.

In the present embodiment, the tank 51 is an example of the "first tank" in the present disclosure. The tank 50 is an example of the "second tank" in the present disclosure. The heater 63 is an example of the "second heater" in the present disclosure. The heater 62 is an example of the "third heater" in the present disclosure.

In the present embodiment, the first path C1 allows the sulfuric acid to be supplied therethrough from the tank 51 to the nozzle 36. The second path C2 allows the sulfuric acid to be supplied therethrough from the tank 51 to the nozzle 36.

Specifically, the processing liquid supply section 30 includes, as the pipe 40 described above, a first pipe 41, a second pipe 42, a third pipe 43, and a fourth pipe 44. The fourth pipe 44 connects the tank 50 and the tank 51. In the present embodiment, the first path C1 is configured by the fourth pipe 44, the tank 50, and the first pipe 41. In the embodiment, the second pipe 42 connects the tank 51 and the nozzle 36. The second path C2 is configured by the second pipe 42.

The processing liquid supply section 30 further includes a fourth valve 34d as the valve 34. The fourth valve 34d is placed in the fourth pipe 44. The fourth valve 34d opens and closes the flow path of the fourth pipe 44. The controller 102 switches the fourth valve 34d from a closed state to an open state when the amount of sulfuric acid in the tank 50 becomes less than a predetermined amount. The tank 50 is accordingly supplied with the sulfuric acid from the tank 51.

The processing liquid supply section 30 includes, as a heater 60, the heater 61, the heater 62, and the heater 63. The heater 62 is a heater for maintaining the temperature of the sulfuric acid in the tank 50 near a predetermined temperature, like the third variation. The heater 62 is the same as that of the third variation, and therefore description thereof is omitted.

The heater 63 is a heater for maintaining the sulfuric acid in the tank 51 near a predetermined temperature. In the second embodiment, the heater 63 heats the tank 51, thereby maintaining the temperature of the sulfuric acid in the tank 51 near a predetermined temperature. The sulfuric acid in tank 51 is maintained near a temperature lower than the temperature of the sulfuric acid in tank 50. The sulfuric acid in the tank 51 is maintained in a range of, for example, 120° C. or higher and lower than 150° C. Note that the heater 62 does not have to heat the tank 51. For example, a circulation pipe for circulating sulfuric acid may be connected to the tank 51 and the circulation pipe may be heated with the heater 63.

In the present embodiment, the processing liquid supply section 30 further includes return pipes 45 and 46, and valves 34e and 34f. The return pipe 45 is connected to a pipe 41b of the first pipe 41. The valve 34e is placed in the return pipe 45. The valve 34e opens and closes the flow path of the return pipe 45.

The return pipe 46 is connected to part, of the second pipe 42, on the downstream side (nozzle 36 side) of the second valve 34b. The valve 34f is arranged in the return pipe 46. The valve 34f opens and closes the flow path of the return pipe 46.

Other structures in the second embodiment are the same as those in the first embodiment.

Figure 11:
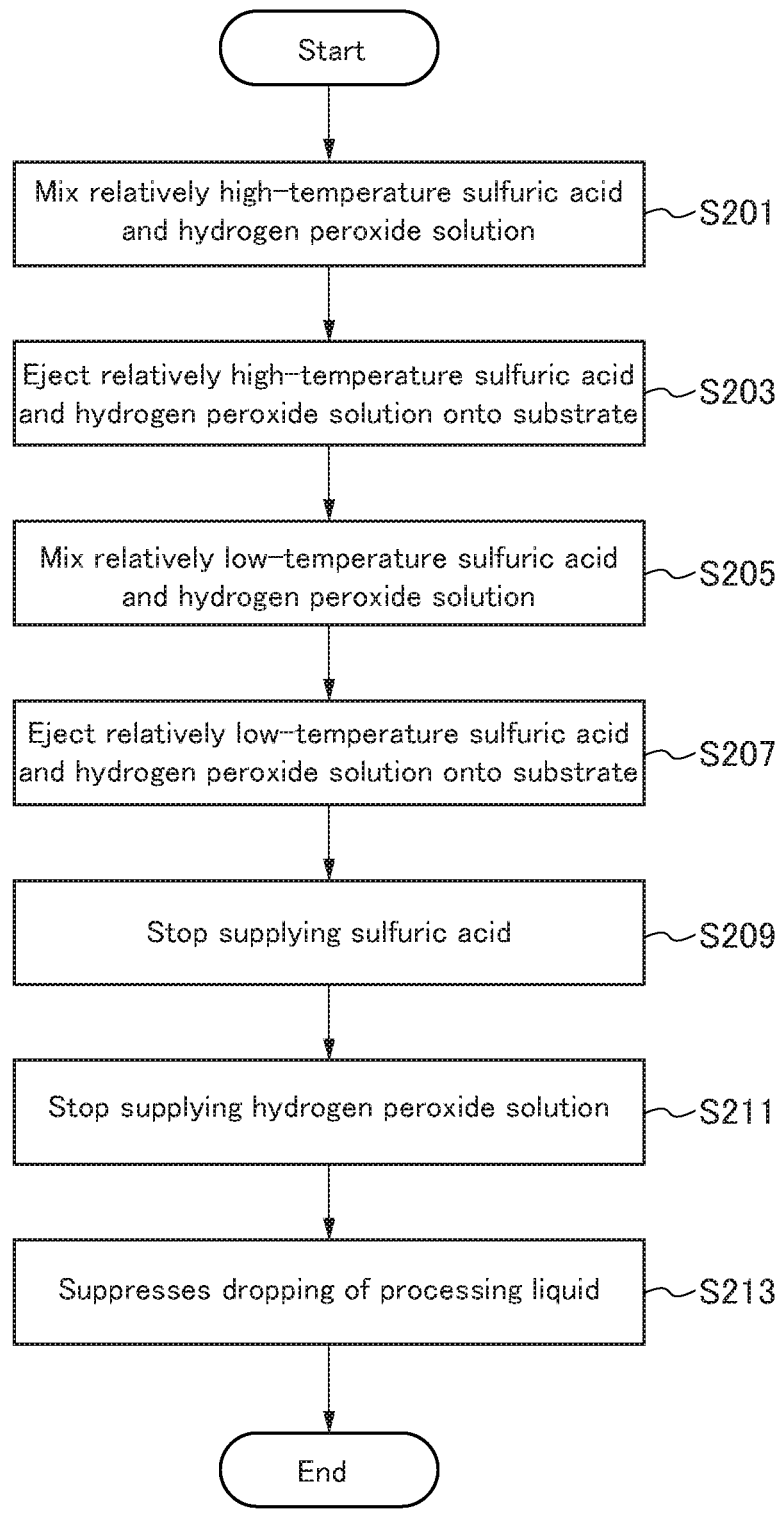
FIG. 11 is a flowchart of a substrate processing method by the substrate processing apparatus according to the second embodiment.

Next, a substrate processing method by the substrate processing apparatus 100, according to the present embodiment will be described with reference to FIGS. 10 and 11. FIG. 11 is a flowchart of the substrate processing method by the substrate processing apparatus 100, according to the present embodiment. Steps S201 to S211 in the present embodiment correspond to Steps S101 to S111 in the first embodiment. Note that Step S203 is an example of the "first ejection" in the present disclosure. Step S207 is an example of the "second "ejection" in the present disclosure. In the present embodiment, different points from those of the first embodiment will be mainly described.

As illustrated in FIG. 11, a controller 102 causes a relatively high-temperature sulfuric acid that has passed through a heating region R1 to mix with a hydrogen peroxide solution. At this time, the second valve 34b, the valve 34e, and the valve 34f are closed. In addition, the heaters 61, 62, and 63 are turned on.

In Step S203, a relatively high-temperature sulfuric acid and the hydrogen peroxide solution are then ejected onto a substrate W.

In Step S205, the controller 102 then causes the relatively low-temperature sulfuric acid to mix with the hydrogen peroxide solution. Specifically, the controller 102 switches the second valve 34b from the closed state to the open state. The controller 102 also switches the first valve 34a from the open state to the closed state. The controller 102 also switches the first valve 34a from the open state to the closed state. Therefore, a relatively low-temperature sulfuric acid is to be supplied from the tank 51 toward the nozzle 36.

In Step S207, the relatively low-temperature sulfuric acid and the hydrogen peroxide solution are then ejected onto the substrate W.

In Step S209, the controller 102 then stops supplying the sulfuric acid.

In Step S211, the controller 102 then stops supplying the hydrogen peroxide solution.

In Step S213, the controller 102 opens the valves 34e and 34f to prevent a processing liquid from dropping from the nozzles 36. Specifically, the controller 102 switches the valve 34e from the closed state to the open state. As a result, the processing liquid remaining between the return pipe 45 and an outlet 36a of the nozzle 36 is drawn into the return pipe 45 by the siphon principle. The controller 102 also switches the valve 34f from the closed state to the open state. As a result, the processing liquid remaining between the return pipe 46 and the outlet 36a of the nozzle 36 is drawn into the return pipe 46 by the siphon principle. It is therefore possible to prevent the processing liquid from dropping from the outlet 36a of the nozzle 36. The controller 102 subsequently closes the valves 34e and 34f.

As described above, the substrate processing method according to the present embodiment is completed.

Other effects and other substrate processing methods in the second embodiment are the same as those in the first embodiment.

(Fifth Variation)

Figure 12:
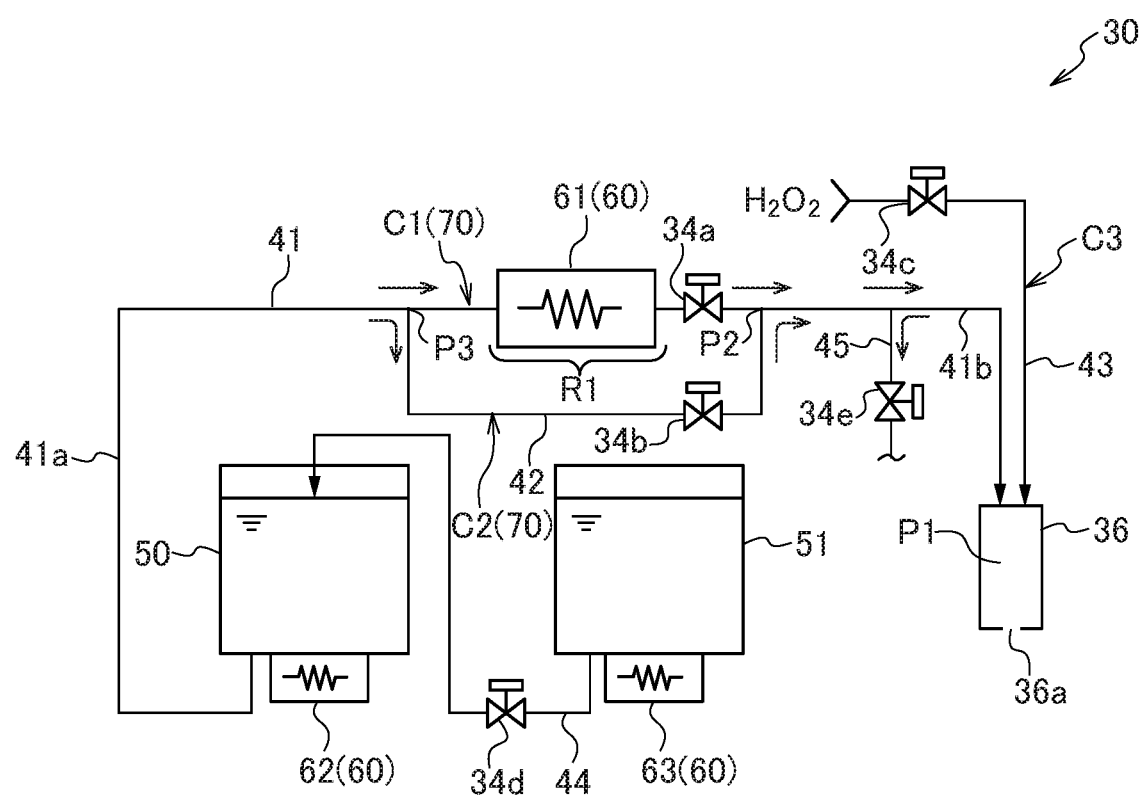
FIG. 12 is a schematic diagram of a processing liquid supply section of a substrate processing apparatus in a fifth variation.

Next, a substrate processing apparatus 100 in a fifth variation of the present disclosure will be described with reference to FIG. 12. In an example to be described in the fifth variation, a first path C1 and a second path C2 diverge on the upstream side of a heating region R1 in the flow direction of sulfuric acid, unlike the second embodiment described with reference to FIGS. 10 and 11. FIG. 12 is a schematic diagram of the processing liquid supply section 30 of the substrate processing apparatus 100 in the fifth variation.

In the fifth variation as illustrated in FIG. 12, a processing liquid supply section 30 includes a diverging point P3 like the second variation. The diverging point P3 is a portion where the first path C1 and the second path C2 diverge. The diverging point P3 is located on the upstream side of the heating region R1 in the flow direction of sulfuric acid. In other words, the first path C1 and the second path C2 diverge on the upstream side of the heating region R1 in the flow direction of sulfuric acid.

In the fifth variation, the first path C1 and the second path C2 meet on the downstream side of the heating region R1 in the flow direction of sulfuric acid like the second variation illustrated in FIG. 7. Specifically, the processing liquid supply section 30 includes a second junction P2 where the first path C1 and the second path C2 meet, like the second variation. The second junction P2 is located on the downstream side of the heating region R1 in the flow direction of sulfuric acid.

Specifically, a second pipe 42 is connected to pipes 41a and 41b of the first pipe 41. A fourth pipe 44 and part of the pipe 41a on the upstream side (tank 50 side) of the diverging point P3 form a common path of the first path C1 and the second path C2. In the fifth variation, the first path C1 is configured by the fourth pipe 44 and the first pipe 41. The second path C2 is configured by the fourth pipe 44, part of the pipe 41a, the second pipe 42, and part of the pipe 41b.

In the fifth variation, a first valve 34a that opens and closes the flow path of the first path C1 is arranged between the diverging point P3 and the second junction P2, like the second variation. A second valve 34b that opens and closes the flow path of the second path C2 is placed in the second pipe 42.

In the fifth variation, the first path C1 and the second path C2 diverge on the upstream side of the heating region R1 and meet on the downstream side of the heating region R1. The fourth pipe 44, the part of the pipe 41a, and the part of the pipe 41b can serve as common pipes for the first path C1 and the second path C2. It is therefore possible to suppress the processing liquid supply section 30 from increasing in size.

Other structures, other effects, and substrate processing methods in the fifth variation are the same as those in the second embodiment.

(Sixth Variation)

Figure 13:
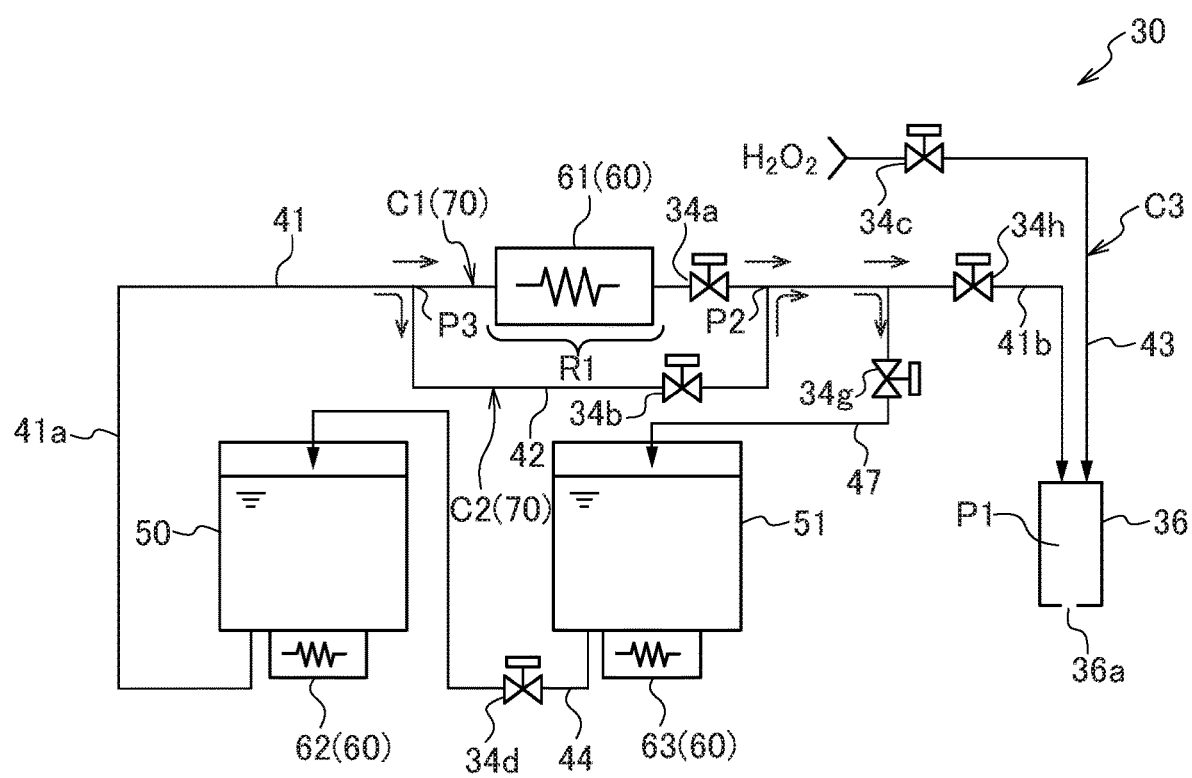
FIG. 13 is a schematic diagram of a processing liquid supply section of a substrate processing apparatus in a sixth variation.

Next, a substrate processing apparatus 100 in a sixth variation of the present disclosure will be described with reference to FIG. 13. In an example to be described in the sixth variation, a circulation pipe 47 for circulating sulfuric acid is provided, unlike the fifth variation described with reference to FIG. 12. FIG. 13 is a schematic diagram of a processing liquid supply section 30 of the substrate processing apparatus 100 in the sixth variation.

In the sixth variation as illustrated in FIG. 13, the processing liquid supply section 30 includes the circulation pipe 47. In the sixth variation, the circulation pipe 47 is connected to a pipe 41b. The circulation pipe 47 is connected to part, of the pipe 41b, on the downstream of a second junction P2, for example. The circulation pipe 47 connects, for example, the pipe 41b and a tank 51. The circulation pipe 47 allows sulfuric acid passing through the pipe 41b to return to the tank 51 therethrough. The circulation pipe 47 may connect a pipe 41a or a second pipe 42 and the tank 51. The circulation pipe 47 may also connect the pipe 41a, the second pipe 42, or the pipe 41b and the tank 50 to allow the sulfuric acid to return to the tank 50 therethrough.

The processing liquid supply section 30 includes a valve 34g and a valve 34h. The valve 34g is placed in the circulation pipe 47. The valve 34g opens and closes the flow path of the circulation pipe 47. The valve 34h is placed in part, of the pipe 41b, on the downstream side of a connection point of the pipe 41b with the circulation pipe 47. The valve 34h opens and closes the flow path of the pipe 41b.

When sulfuric acid is supplied to a nozzle 36, the valve 34g is closed and the valve 34h is opened. When the sulfuric acid is returned to the tank 51 (or tank 50), the valve 34g is opened and the valve 34h is closed.

In the sixth variation, when the sulfuric acid is not supplied to the nozzle 36, the sulfuric acid in the tank 50 is returned to the tank 50 via the pipe 41a, the second pipe 42 (or a heating region R1), the pipe 41b, the circulation pipe 47, the tank 51, and a fourth pipe 44, for example. That is, a circulation path for circulating the sulfuric acid in tank 50 is configured by the pipe 41a, the second pipe 42 (or the heating region R1), the pipe 41b, the circulation pipe 47, the tank 51, and the fourth pipe 44. It is therefore possible to maintain the temperature of the sulfuric acid inside the pipe 41a, the second pipe 42, and the pipe 41b near a predetermined temperature.

In the example of the sixth variation, the heater 62 heats the tank 50, thereby circulating the sulfuric acid at a predetermined temperature. However, the present disclosure is not limited to this. For example, the heater 62 may heat the pipe 41a, thereby circulating the sulfuric acid at a predetermined temperature.

Other structures and other effects in the sixth variation are the same as those in the second embodiment. The substrate processing method in the sixth variation is the same as that in the second variation.

Third Embodiment

Figure 14:
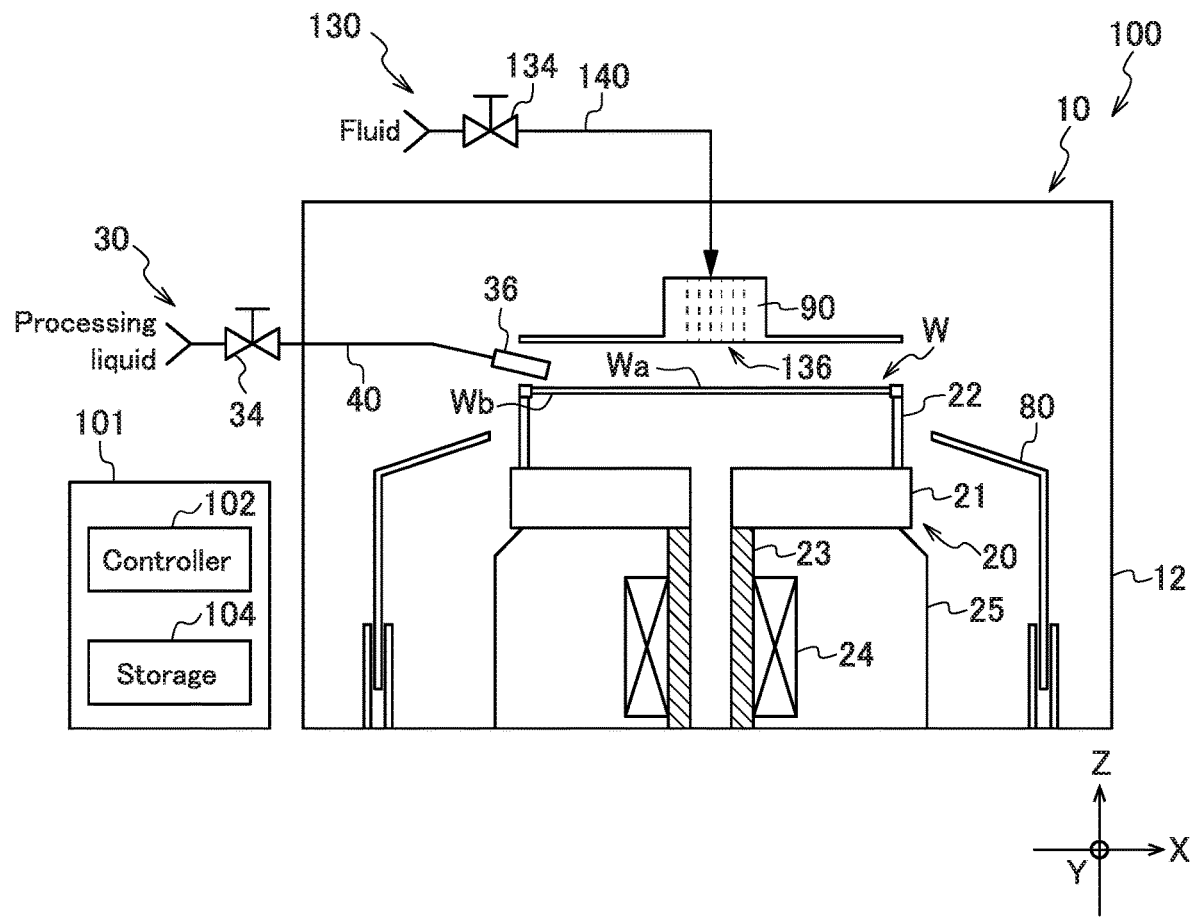
FIG. 14 is a schematic diagram of a substrate processing unit in a substrate processing apparatus according to a third embodiment.

Next, a substrate processing apparatus 100 according to a third embodiment of the present disclosure will be described with reference to FIGS. 14, 15, and 16. In an example to be described in the third embodiment, a relatively low-temperature hydrogen peroxide mixture is obtained using sulfuric acid that has passed through a first path C1, unlike the first and second embodiments. FIG. 14 is a schematic diagram of a substrate processing unit 10 in the substrate processing apparatus 100 according to the third embodiment. Different points from the first embodiment will be mainly described below.

As illustrated in FIG. 14, the substrate processing apparatus 100 includes a shielding member 90. The shielding member 90 is housed within a chamber 12. The shielding member 90 shields a substrate W held by a substrate holding section 20 from above.

The shielding member 90 is placed above the substrate holding section 20. The shielding member 90 faces the substrate W. The outer diameter of the shielding member 90 is approximately equal to the outer diameter of the substrate W or slightly larger than the outer diameter of the substrate W. The shielding member 90 is movable relative to the substrate W between an approach position and a retracted position. Note that the substrate processing apparatus 100 includes a moving mechanism (not illustrated) that moves the shielding member 90 between the approach position and the retracted position. When the shielding member 90 is positioned at the approach position, the shielding member 90 descends and approaches the upper surface Wa of the substrate W with a predetermined gap. At the approach position, the shielding member 90 covers the upper surface Wa of the substrate W to shield the substrate W from above. When the shielding member 90 is positioned at the retracted position, the shielding member 90 is placed at a position retracted above the approach position. When the shielding member 90 moves from the approach position to the retracted position, the shielding member 90 rises and moves away from the substrate W.

When a processing liquid is ejected from a nozzle 36 onto the substrate W, the shielding member 90 receives the liquid splashed from the substrate W. It is therefore possible to suppress scattering of the processing liquid around the substrate holding section 20 and the like.

The substrate processing apparatus 100 further includes a fluid supply section 130. The fluid supply section 130 includes a pipe 140, a valve 134, and a nozzle 136. The shielding member 90 is provide with the nozzle 136. The nozzle 136 ejects a fluid onto the upper surface Wa of the substrate W. The fluid include a processing liquid or gas. The processing liquid may include, but not particularly limited to, a rinse liquid or IPA, for example. The gas may be, but not particularly limited to, nitrogen gas or clean air, for example.

For example, the nozzle 136 may eject the fluid onto the central portion of the substrate W, or may eject the fluid onto a region between the central portion and the peripheral portion of the substrate W. The nozzle 136 has outlets (not illustrated) and ejects the fluid from the outlets. The number of outlets may be, but not particularly limited to, one or two or more. The present embodiment is provide with a plurality of outlets. The nozzle 136 is connected to the pipe 140. The pipe 140 is supplied with the fluid from a supply source. The valve 134 opens and closes the flow path inside the pipe 140.

The valve 134 adjusts the opening degree of the pipe 140 to adjust the flow rate of the fluid to be supplied to the pipe 140. Specifically, the valve 134 includes a valve body (not illustrated) in which a valve seat is provided, a valving element that opens and closes the valve seat, and an actuator (not illustrated) that moves the valving element between an open position and a closed position.

Next, a processing liquid supply section 30 of the substrate processing apparatus 100 according to the present embodiment will be described with reference to FIG. 15. FIG. 15 is a schematic plan view of the substrate processing apparatus 100 according to the present embodiment.

Figure 15:
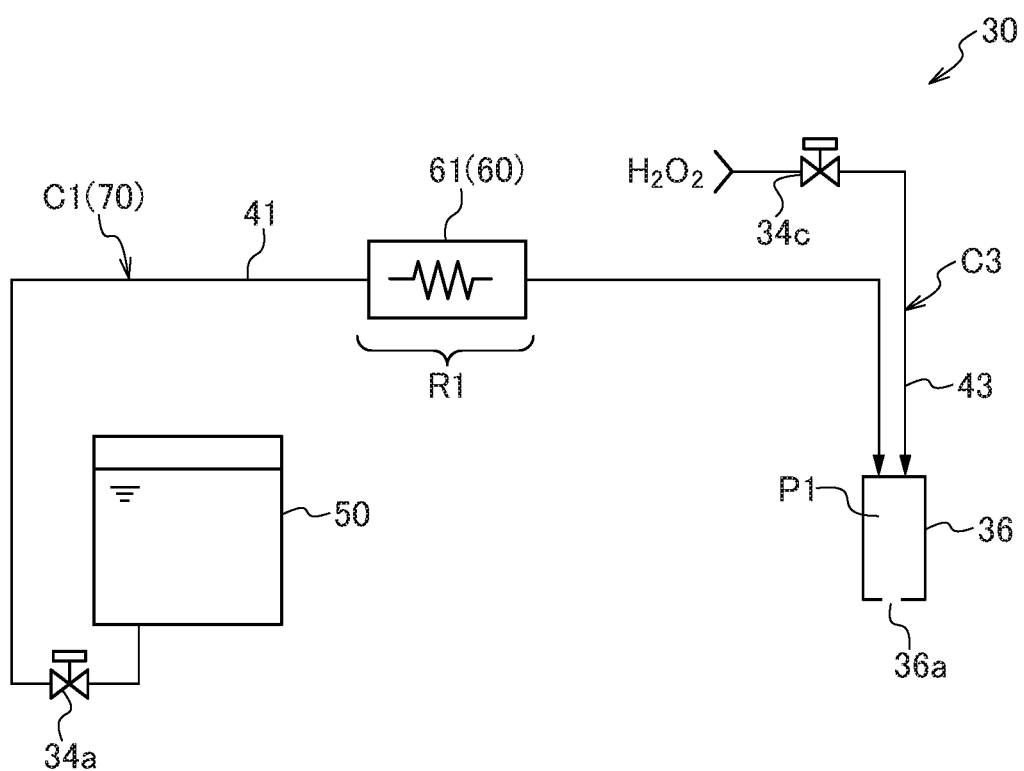
FIG. 15 is a schematic diagram of a processing liquid supply section of the substrate processing apparatus according to the third embodiment.

In the third embodiment as illustrated in FIG. 15, the processing liquid supply section 30 includes a tank 50, a path 70, a hydrogen peroxide supply path C3, and a heater 61, like the first embodiment. The path 70 includes the first path C1. Note that the path 70 in the present embodiment does not include the second path C2, unlike the first embodiment. The tank 50 stores sulfuric acid. Note that the tank 50 is an example of the "first tank" in the present disclosure. The heater 61 is an example of the "first heater" in the present disclosure.

The heater 61 can heat a heating region R1 of the first path C1. In the present embodiment, the heater 61 is turned on and off by a controller 102. That is, the heater 61 is switched between a heating state in which the heating region R1 is heated and a non-heating state in which the heating region R1 is not heated.

The heater 61 heats the heating region R1, thereby raising the temperature of the sulfuric acid passing through the heating region R1. For example, the temperature of sulfuric acid that has been heated in the heating region R1 while passing through the heating region R1 becomes a first temperature. The first temperature is, for example, 170° C. to 190° C. or higher.

When the heater 61 does not heat the heating region R1, the temperature of sulfuric acid passing through the heating region R1 does not rise. When the heater 61 does not heat the heating region R1, the sulfuric acid that has passed through the heating region R1 has a second temperature. The second temperature is, for example, in a range from normal temperature to 150° C. That is, the sulfuric acid that is not heated in the heating region R1 while passing through the heating region R1 has a lower temperature than that of the sulfuric acid that has been heated in the heating region R1. The sulfuric acid that has been heated in the heating region R1 may be hereinafter referred to as relatively high-temperature sulfuric acid. The sulfuric acid that has not been heated in the heating region R1 may be referred to as relatively low-temperature sulfuric acid.

The processing liquid supply section 30 includes, as a pipe 40, a first pipe 41 and a third pipe 43. Note that the processing liquid supply section 30 in the present embodiment includes no second pipe 42, unlike the first embodiment.

The processing liquid supply section 30 also includes, as a valve 34, a first valve 34*a* and a hydrogen peroxide valve 34*c*. Note that the processing liquid supply section 30 in the present embodiment includes no second valve 34*b*, unlike the first embodiment.

In the present embodiment, the relatively high-temperature sulfuric acid heated in the heating region R1 and a hydrogen peroxide solution react with each other to form a high-temperature (for example, 200° C. or higher) hydrogen peroxide mixture.

The relatively low-temperature sulfuric acid that has not been heated in the heating region R1 is mixed with the hydrogen peroxide solution at a temperature lower than that of the heated relatively high-temperature sulfuric acid. Accordingly, the relatively low-temperature sulfuric acid and the hydrogen peroxide solution react with each other to form a relatively low-temperature hydrogen peroxide mixture. The flow rate of the relatively low-temperature sulfuric acid (amount of flow per unit time) in the present embodiment may be, but not particularly limited to, substantially the same as the flow rate of the relatively high-temperature sulfuric acid.

The controller 102 sets the output of the heater 61 to a first output, thereby changing the sulfuric acid passing through the first path C1 to relatively high-temperature sulfuric acid. The relatively high-temperature sulfuric acid has a first temperature. The first temperature is a temperature in a range between 170° C. and 190° C. or higher, for example. The controller 102 also sets the output of the heater 61 to a second output lower than the first output, thereby changing the sulfuric acid passing through the first path C1 to relatively low-temperature sulfuric acid. The relatively low-temperature sulfuric acid has a second temperature lower than the first temperature. The second temperature is in a range from normal temperature to 150° C.

In the present embodiment, the controller 102 turns on the heater 61, thereby setting the sulfuric acid passing through the first path C1 to the sulfuric acid having the first temperature. The controller 102 also turns off the heater 61, thereby setting the sulfuric acid passing through the first path C1 to the sulfuric acid having the second temperature.

In the present embodiment, the controller 102 controls the heater 61 so that the relatively low-temperature sulfuric acid and the hydrogen peroxide solution are mixed and then ejected from the nozzle 36 onto the substrate W after the relatively high-temperature sulfuric acid and the hydrogen peroxide solution are mixed and then ejected from the nozzle 36 onto the substrate W. Therefore, when the supply of sulfuric acid is stopped in order to rinse away the sulfuric acid-hydrogen peroxide mixture on the substrate W with the hydrogen peroxide solution, it is possible to prevent the high-temperature sulfuric acid-hydrogen peroxide mixture from becoming higher in temperature, the rapid change in the temperature of the substrate W can be suppressed. Therefore, damage to the substrate W such as pattern peeling on the substrate W can be suppressed.

In the present embodiment, it is not necessary to adjust the mixing ratio of sulfuric acid and hydrogen peroxide solution to a desired ratio in order to suppress damage to the substrate W, like the first embodiment. Time can consequently be shortened compared to the method of adjusting the mixing ratio to the desired ratio.

In the present embodiment, it is also not necessary to provide the second path C2 and the second valve 34*b* unlike the first embodiment. The configuration of the substrate processing apparatus 100 can be simplified accordingly.

Other structures in the third embodiment are the same as those in the first embodiment.

Next, a substrate processing method by the substrate processing apparatus 100 according to the present embodiment will be described with reference to FIGS. 15 and 16. FIG. 16 is a flowchart of the substrate processing method by the substrate processing apparatus 100 according to the present embodiment. Steps S301 to S311 in the present embodiment correspond to Steps S101 to S111 in the first embodiment. Note that Step S301 is an example of the "first distribution" in the present disclosure. Step S303 is an example of the "first ejection" in the present disclosure. Step S305 is an example of the "second distribution" in the present disclosure. Step S307 is an example of the "second ejection" in the present disclosure. The present embodiment will mainly describe different points from those of the first embodiment.

Figure 16:
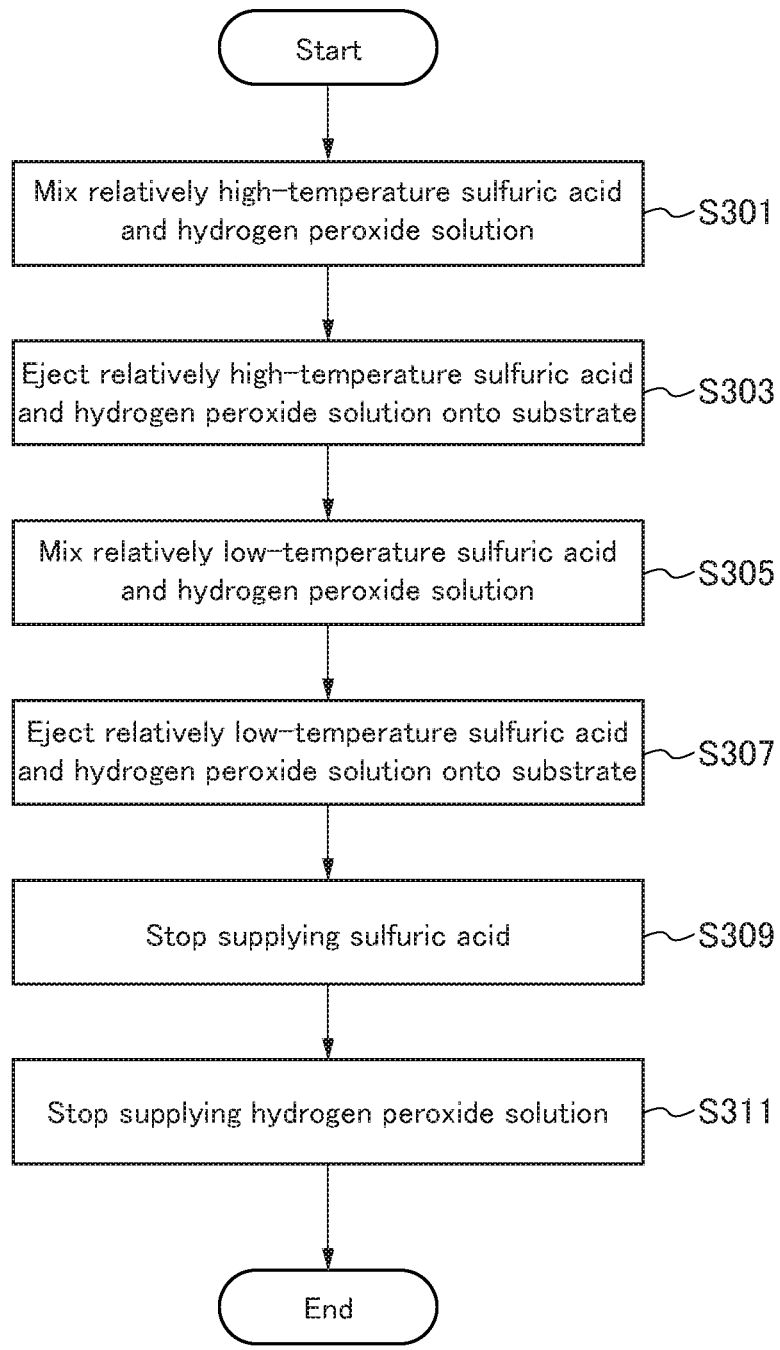
FIG. 16 is a flowchart of a substrate processing method by the substrate processing apparatus according to the third embodiment.

As illustrated in FIG. 16, in Step S301, the controller 102 causes the relatively high-temperature sulfuric acid, which has passed through the heating region R1, to mix with the hydrogen peroxide solution. At this time, the heater 61 is turned on, and the sulfuric acid from the tank 50 is heated in the heating region R1 to become relatively high-temperature sulfuric acid.

In Step S303, the relatively high-temperature sulfuric acid and the hydrogen peroxide solution are ejected onto the substrate W.

In Step S305, the controller 102 then causes the relatively low-temperature sulfuric acid to mix with the hydrogen peroxide solution. Specifically, the controller 102 turns off the heater 61. The heater 61 is therefore switched from the ON state to the OFF state. The sulfuric acid passing through the first path C1 is therefore not heated in the heating region R1. As a result, the relatively low-temperature sulfuric acid is supplied to the nozzle 36.

In Step S307, the relatively low-temperature sulfuric acid and the hydrogen peroxide solution are then ejected onto the substrate W.

In Step S309, the controller 102 then stops supplying the sulfuric acid.

In Step S311, the controller 102 then stops supplying the hydrogen peroxide solution.

As described above, the substrate processing method according to the present embodiment is completed.

In the third embodiment, after the relatively high-temperature sulfuric acid and the hydrogen peroxide solution are mixed and then ejected onto the substrate W, the output of the heater 61 is switched, so that the relatively low-temperature sulfuric acid and the hydrogen peroxide solution are mixed and then ejected onto the substrate W. It is therefore possible to suppress damage to the substrate W such as pattern peeling on the substrate W only by switching the output of the heater 61.

In the substrate processing described above, for example, a rinse liquid may be ejected from the nozzle 136 provided for the shielding member 90. In this case, the rinse liquid may be ejected from the nozzle 136 onto the substrate W after Step S311.

In the substrate processing described above, for example, nitrogen gas may be ejected from the nozzle 136 provided for the shielding member 90. For example, nitrogen gas may be ejected from the nozzle 136 while Steps S303 to S309 are being performed. In this case, a downward airflow is generated above the substrate W. It is therefore possible to prevent the processing liquid ejected from the nozzle 36 onto the substrate W from splashing onto the substrate W and being scattered around the surroundings.

Other substrate processing methods and other effects in the third embodiment are the same as those in the first embodiment.

(Seventh Variation)

Figure 17:
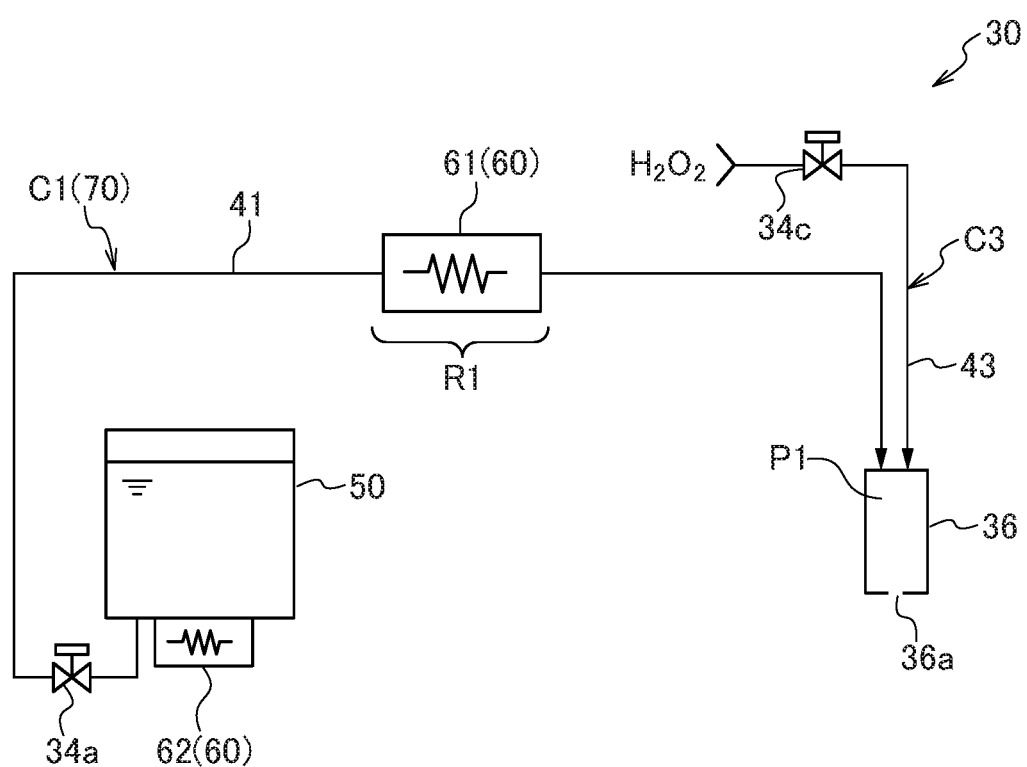
FIG. 17 is a schematic diagram of a processing liquid supply section of a substrate processing apparatus in a seventh variation.

Next, a substrate processing apparatus 100 in a seventh variation of the present disclosure will be described with reference to FIG. 17. In an example to be described in the seventh variation, a processing liquid supply section 30 includes a heater 62, unlike the third embodiment described with reference to FIGS. 15 and 16. FIG. 17 is a schematic diagram of the processing liquid supply section 30 of the substrate processing apparatus 100 in the seventh variation.

In the seventh variation as illustrated in FIG. 17, the processing liquid supply section 30 further includes the heater 62 as the heater 60 described above. Note that the heater 62 is an example of the "second heater" in the present disclosure. The heater 62 is a heater for maintaining the temperature of sulfuric acid in a tank 50 near a predetermined temperature. In the seventh variation, the heater 62 heats the tank 50, thereby maintaining the temperature of the sulfuric acid in the tank 50 near a predetermined temperature. The temperature of the sulfuric acid in the tank 50 is maintained in a range of 150° C. or higher, for example. Note that the heater 62 does not have to heat the tank 50. For example, a circulation pipe for circulating sulfuric acid may be connected to the tank 50 and the circulation pipe may be heated with the heater 62.

The seventh variation is provided with the heater 62 that maintains the temperature of the sulfuric acid in the tank 50 near a predetermined temperature. It is therefore possible to easily heat the sulfuric acid passing through the heating region R1 to a desired temperature (for example, 170° C. to 190° C. or higher).

Other structures, other effects, and substrate processing methods in the seventh variation are the same as those in the third embodiment.

(Eighth Variation)

Figure 18:
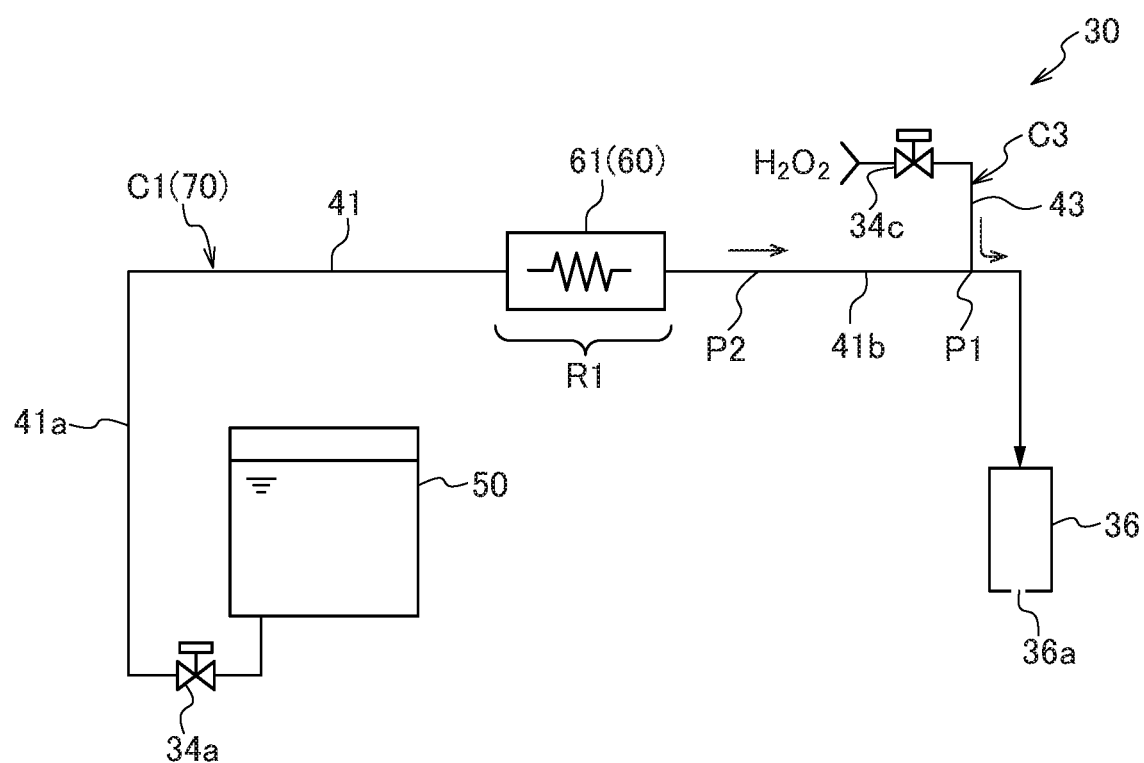
FIG. 18 is a schematic diagram of a processing liquid supply section of a substrate processing apparatus in an eighth variation.

Next, a substrate processing apparatus 100 in an eighth variation of the present disclosure will be described with reference to FIG. 18. In an example to be described in the eighth variation, a third pipe 43 is connected to a first pipe 41, unlike the third embodiment described with reference to FIG. 15. FIG. 18 is a schematic diagram of a processing liquid supply section 30 of the substrate processing apparatus 100 in the eighth variation.

In the eighth variation as illustrated in FIG. 18, a first path C1 and a hydrogen peroxide supply path C3 meet between a nozzle 36 and a heating region R1.

Specifically, the third pipe 43 is connected to a pipe 41b of the first pipe 41. The hydrogen peroxide supply path C3 is configured by the third pipe 43 and part of the pipe 41b. Part, of the pipe 41b, on the downstream side (nozzle 36 side) of a first junction P1 also serves as a common pipe for the first path C1 and the hydrogen peroxide supply path C3.

In the eighth variation, the third pipe 43 is connected to the first pipe 41. This enables part of the first pipe 41 to serve as a common pipe. It is therefore possible to prevent the processing liquid supply section 30 from increasing in size. The time from mixing to ejecting is longer than that in the case where the sulfuric acid and the hydrogen peroxide solution are mixed in the nozzle 36. It is therefore possible to mix the sulfuric acid and the hydrogen peroxide solution more uniformly.

Other structures, other effects, and substrate processing methods in the eighth variation are the same as those in the third embodiment.

Fourth Embodiment

Figure 19:
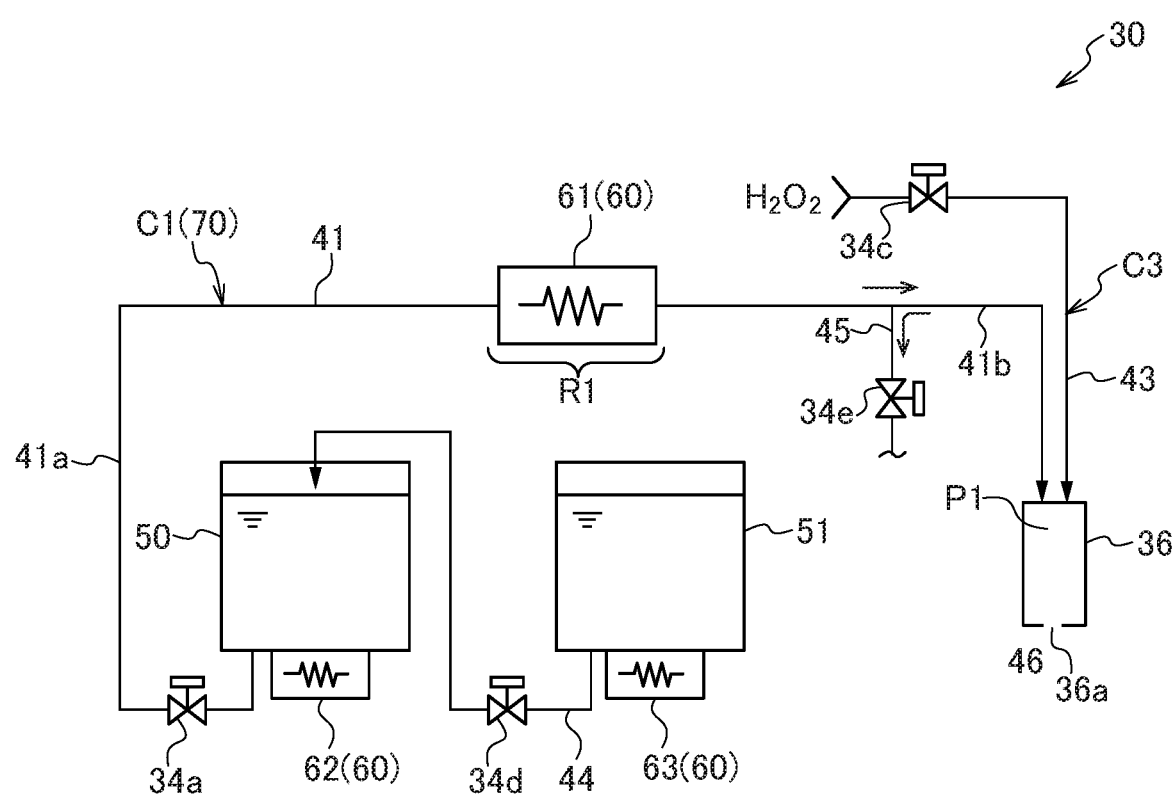
FIG. 19 is a schematic diagram of a processing liquid supply section of the substrate processing apparatus according to a fourth embodiment of the present disclosure.

Next, a substrate processing apparatus 100 according to a fourth embodiment of the present disclosure will be described with reference to FIGS. 19 and 20. In an example to be described in the fourth embodiment, a processing liquid supply section 30 includes a tank 50 and a tank 51, unlike the third embodiment described with reference to FIGS. 15 and 16. FIG. 19 is a schematic diagram of the processing liquid supply section 30 of the substrate processing apparatus 100 according to the present embodiment. Different points from the third embodiment will be mainly described below.

In the fourth embodiment as illustrated in FIG. 19, the processing liquid supply section 30 includes the tanks 50 and 51, a path 70, a hydrogen peroxide supply path C3, and heaters 61, 62, and 63. The tanks 50 and 51 store sulfuric acid. The Path 70 includes a first path C1. Note that the path 70 in the fourth embodiment does not include any second path C2, unlike the second embodiment.

In the present embodiment, the tank 51 is an example of the "first tank" in the present disclosure. The tank 50 is an example of the "second tank" in the present disclosure. The heater 63 is an example of the "second heater" in the present disclosure. The heater 62 is an example of the "third heater" in the present disclosure.

In the present embodiment, the first path C1 allows sulfuric acid to be supplied therethrough from the tank 51 to a nozzle 36.

Specifically, the processing liquid supply section 30 includes, as the pipe 40 described above, a first pipe 41, a third pipe 43, and a fourth pipe 44. The fourth pipe 44 connects the tank 50 and the tank 51. In the present embodiment, the first path C1 is configured by the fourth pipe 44, the tank 50, and the first pipe 41.

The processing liquid supply section 30 further includes a fourth valve 34*d* as a valve 34. The fourth valve 34*d* is placed in the fourth pipe 44. The fourth valve 34*d* opens and closes the flow path of the fourth pipe 44. A controller 102 switches the fourth valve 34*d* from a closed state to an open state when the amount of sulfuric acid in the tank 50 becomes less than a predetermined amount. Thus, the sulfuric acid is supplied from the tank 51 to the tank 50.

The processing liquid supply section 30 includes, as a heater 60, the heater 61, the heater 62, and the heater 63. The heater 62 is a heater for maintaining the temperature of the sulfuric acid in the tank 50 near a predetermined temperature, like the seventh variation. Since the heater 62 is the same as that in the seventh variation, the explanation thereof is omitted.

The heater 63 is a heater for maintaining the temperature of the sulfuric acid in the tank 51 near a predetermined temperature. In the present embodiment, the heater 63 heats the tank 51, thereby maintaining the temperature of the sulfuric acid in the tank 51 near a predetermined temperature. The sulfuric acid in tank 51 is maintained near a temperature lower than that of the sulfuric acid in the tank 50. The temperature of the sulfuric acid in the tank 51 is maintained in a range between 120° C. or higher and lower than 150° C., for example. Note that the heater 62 does not have to heat the tank 51. For example, a circulation pipe for circulating sulfuric acid may be connected to the tank 51 and the circulation pipe may be heated with the heater 63.

In the present embodiment, the processing liquid supply section 30 further includes a return pipe 45 and a valve 34*e*. The return pipe 45 is connected to a pipe 41*b* of the first pipe 41. The valve 34*e* is placed in the return pipe 45. The valve 34*e* opens and closes the flow path of the return pipe 45.

Other structures in the fourth embodiment are the same as those in the third embodiment.

Next, a substrate processing method by the substrate processing apparatus 100 according to the present embodiment will be described with reference to FIGS. 19 and 20. FIG. 20 is a flowchart of the substrate processing method by the substrate processing apparatus 100 according to the present embodiment. Steps S401 to S411 in the present embodiment correspond to Steps S301 to S311 in the third embodiment. Note that Step S401 is an example of the "first distribution" in the present disclosure. Step S403 is an example of the "first ejection" in the present disclosure. Step S405 is an example of the "second distribution" in the present disclosure. Step S407 is an example of the "second ejection" in the present disclosure. The present embodiment mainly describes different points from those in the third embodiment.

Figure 20:
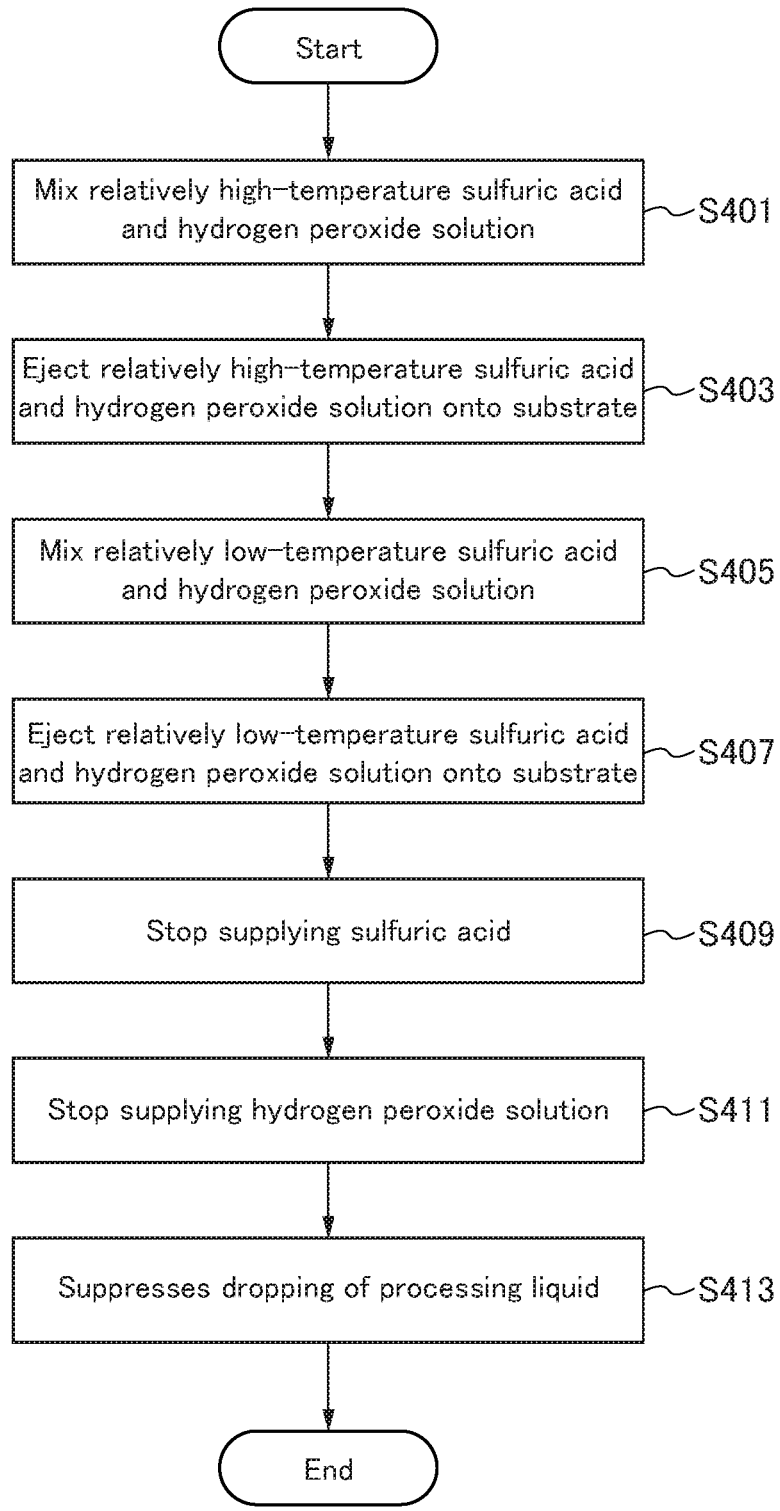
FIG. 20 is a flowchart of a substrate processing method by the substrate processing apparatus according to the fourth embodiment.

As illustrated in FIG. 20, in Step S401, the controller 102 causes the relatively high-temperature sulfuric acid, which has passed through a heating region R1, to mix with a hydrogen peroxide solution. At this time, the heaters 61, 62, and 63 are turned on. Sulfuric acid from tank 50 is therefore heated in the heating region R1 to be relatively high-temperature sulfuric acid.

In Step S403, the relatively high-temperature sulfuric acid and the hydrogen peroxide solution are then ejected onto the substrate W.

In Step S405, the controller 102 then causes the relatively low-temperature sulfuric acid to mix with the hydrogen peroxide solution.

In Step S407, the relatively low-temperature sulfuric acid and the hydrogen peroxide solution are then ejected onto the substrate W.

In Step S409, the controller 102 then stops supplying the sulfuric acid.

In Step S411, the controller 102 then stops supplying the hydrogen peroxide solution.

In Step S413, the controller 102 then opens the valve 34*e* to prevent the processing liquid from dropping from the nozzle 36. Specifically, the controller 102 switches the valve 34*e* from a closed state to an open state. As a result, the processing liquid remaining between the return pipe 45 and an outlet 36*a* of the nozzle 36 is drawn into the return pipe 45 by the siphon principle. It is therefore possible to prevent the processing liquid from dropping from the outlet 36*a* of the nozzle 36. The controller 102 subsequently closes the valve 34*e*.

As described above, the substrate processing method according to the present embodiment is completed.

Other effects and other substrate processing methods in the fourth embodiment are the same as those in the third embodiment.

(Ninth Variation)

Figure 21:
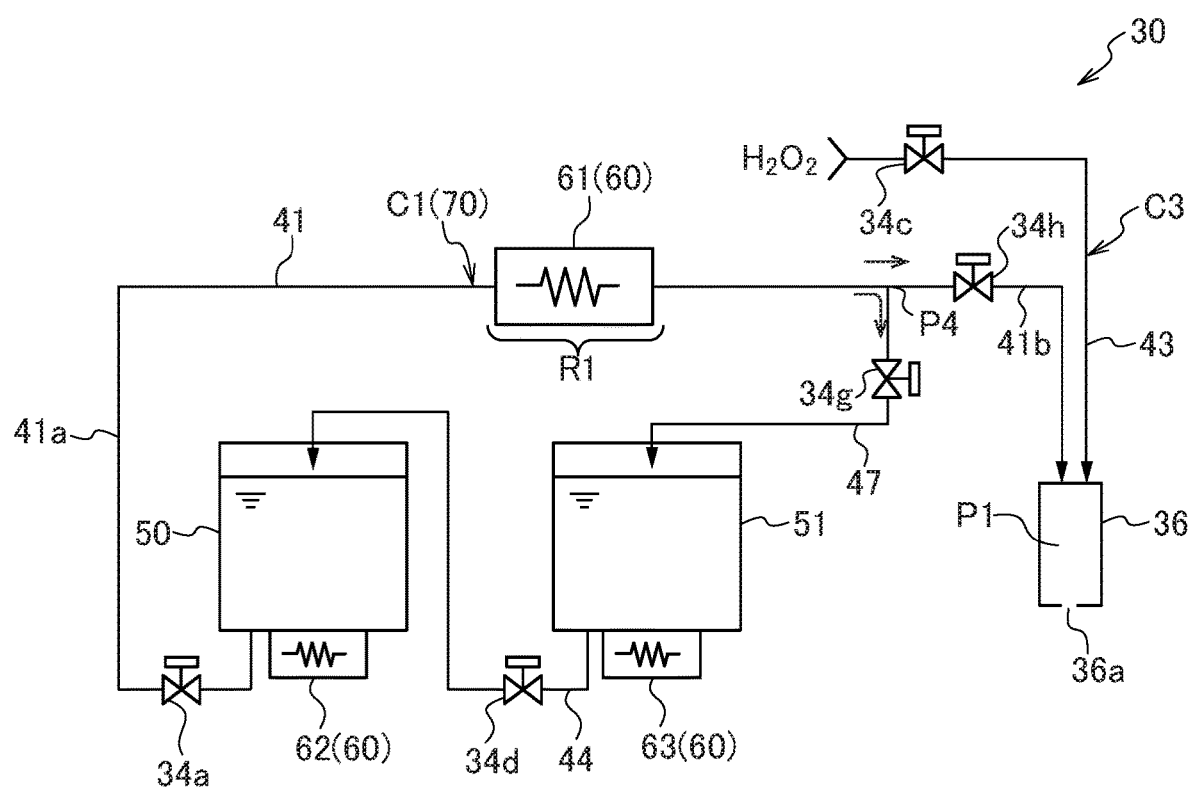
FIG. 21 is a schematic diagram of a processing liquid supply section of a substrate processing apparatus in a ninth variation.

Next, a substrate processing apparatus 100 in a ninth variation of the present disclosure will be described with reference to FIG. 21. In an example to be described in the ninth variation, a circulation pipe 47 that circulates sulfuric acid is provided, unlike the third and fourth embodiments. FIG. 21 is a schematic diagram of a processing liquid supply section 30 of the substrate processing apparatus 100 in the ninth variation.

In the ninth variation as illustrated in FIG. 21, the processing liquid supply section 30 has a diverging point P4 and the circulation pipe 47. The diverging point P4 is a point where a first path C1 and the circulation pipe 47 diverge. In the ninth variation, the diverging point P4 is placed in the pipe 41*b*. That is, in the ninth variation, the circulation pipe 47 is connected to the pipe 41*b*. The circulation pipe 47 connects the pipe 41*b* and a tank 51, for example. The circulation pipe 47 allows sulfuric acid passing through the pipe 41*b* to return to the tank 51 therethrough. Note that the circulation pipe 47 may connect the pipe 41*b* and the tank 50 to allow the sulfuric acid to return to the tank 50 therethrough.

In the ninth variation, a heater 61 is placed in part, of the first path C1, on the upstream side of the diverging point P4 in the flow direction of sulfuric acid. It is therefore possible to heat the sulfuric acid passing through a circulation path with the heater 61.

The processing liquid supply section 30 includes a valve 34*g* and a valve 34*h*. The valve 34*g* is placed in the circulation pipe 47. The valve 34*g* opens and closes the flow path of the circulation pipe 47. The valve 34*h* is placed in part, of the pipe 41*b*, on the downstream side of the diverging point P4. The valve 34*h* opens and closes the flow path of the pipe 41*b*.

When the sulfuric acid is supplied to the nozzle 36, the valve 34*g* is closed and the valve 34*h* is opened. When the sulfuric acid is returned to the tank 51 (or tank 50), the valve 34*g* is opened and the valve 34*h* is closed.

In the ninth variation, when the sulfuric acid is not supplied to the nozzle 36, the sulfuric acid in the tank 50 is returned to the tank 50 via a pipe 41*a*, a heating region R1, a pipe 41*b*, the circulation pipe 47, the tank 51, and a fourth pipe 44, for example. That is, the circulation path that allows the sulfuric acid in the tank 50 to circulate therethrough is configured by the pipe 41a, the heating region R1, the pipe 41b, the circulation pipe 47, the tank 51, and the fourth pipe 44. This enables the temperature of the sulfuric acid inside the pipes 41a and 41b to be maintained near a predetermined temperature.

Note that although, in an example of the ninth variation, the heater 62 heats the tank 50 to circulate the sulfuric acid at a predetermined temperature, the present disclosure is not limited to this. For example, the heater 62 may heat the pipe 41a to circulate the sulfuric acid at a predetermined temperature Other structures and other effects in the ninth variation are the same as those in the fourth embodiment. The substrate processing method in the ninth variation is the same as the substrate processing method according to the third embodiment.

(Tenth Variation)

Figure 22:
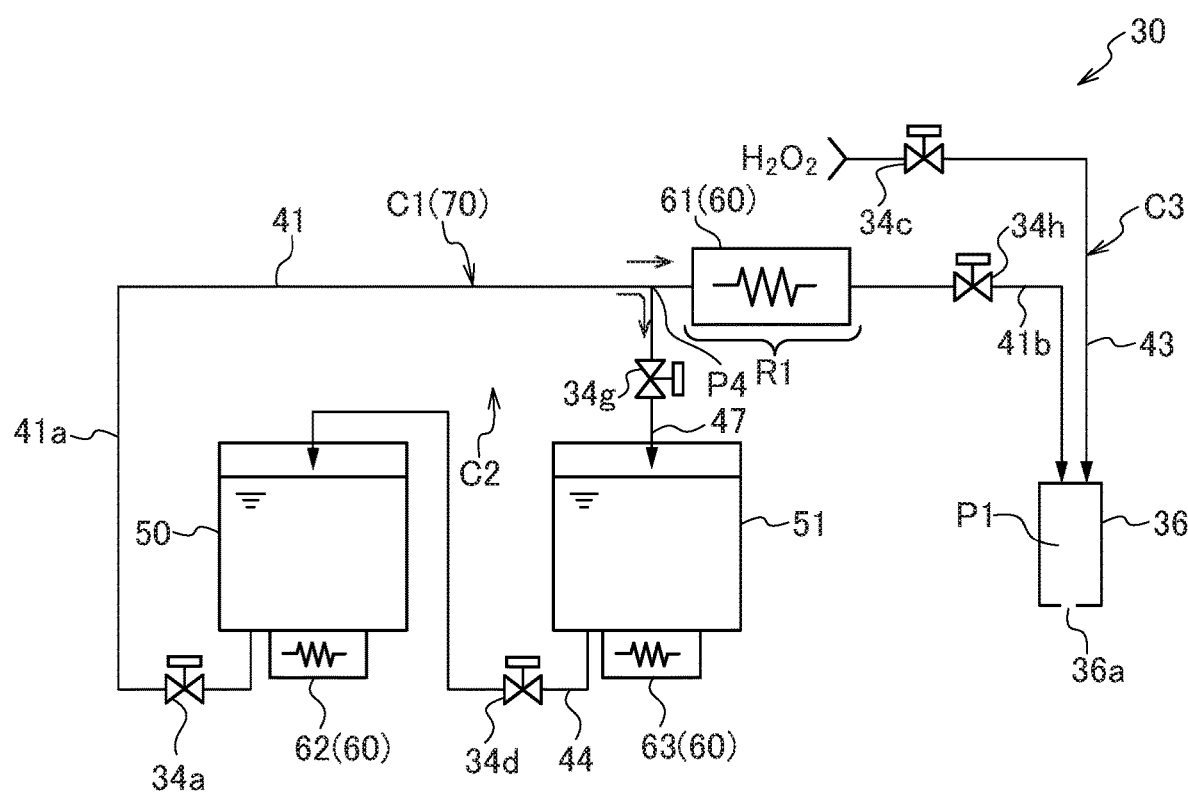
FIG. 22 is a schematic diagram of a processing liquid supply section of a substrate processing apparatus in a tenth variation.

Next, a substrate processing apparatus 100 in a tenth variation of the present disclosure will be described with reference to FIG. 22. In an example to be described in the tenth variation, a heater 61 is located on the downstream side of a diverging point P4. FIG. 22 is a schematic diagram of a processing liquid supply section 30 of the substrate processing apparatus 100 in the tenth variation.

In the tenth variation as illustrated in FIG. 22, the processing liquid supply section 30 includes the diverging point P4 and a circulation pipe 47, like the ninth variation. The diverging point P4 is a point where a first path C1 and the circulation pipe 47 diverge. In the tenth variation, the diverging point P4 is placed in the pipe 41a. That is, the circulation pipe 47 is connected to the pipe 41a.

In the tenth variation, the heater 61 is placed in part, of the first path C1, on the downstream side of the diverging point P4 in the flow direction of sulfuric acid. That is, the heater 61 is arranged between a circulation path and the nozzle 36.

In the tenth variation, the heater 61 is placed in the part, of the first pipe 41, on the downstream side of the diverging point P4, as described above. The heater 61 can therefore be placed near the nozzle 36. It is therefore possible to prevent the temperature of the sulfuric acid from decreasing before the sulfuric acid that has been heated with the heater 61 reaches the nozzle 36.

Other structures, other effects, and substrate processing methods in the tenth embodiment are the same as those in the ninth variation.

The embodiments of the present disclosure have been described above with reference to the drawings. However, the present disclosure is not limited to the above-described embodiments, and may be implemented in various aspects without departing from the gist thereof. In addition, constituent elements disclosed in the above embodiments can be modified as appropriate. For example, some constituent elements of all constituent elements illustrated in an embodiment may be added to constituent elements of another embodiment, or some constituent elements of all constituent elements illustrated in an embodiment may be removed from the embodiment.

The drawings mainly illustrate various constituent elements schematically to facilitate understanding. Aspects such as thickness, length, number, and interval of the constituent elements illustrated in the drawings may differ in practice for convenience of drawing preparation. Furthermore, aspects such as material, shape, and dimension of the constituent elements illustrated in the above embodiment are only examples and not particular limitations. The configuration of constituent elements illustrated in the above embodiments is an example and is not particularly limited, and various modifications may be made without substantially deviating from the effects of the present disclosure.

In the example of the fourth variation illustrated in FIG. 9, the first path C1 and the hydrogen peroxide supply path C3 meet between the nozzle 36 and the heating region R1. However, the present disclosure is not limited to this. The first path C1 and the hydrogen peroxide supply path C3 may meet between the nozzle 36 and the heating region R1 even in the first embodiment, the first to third variations, the second embodiment, the fifth variation, the sixth variation, the third embodiment, the seventh variation, the fourth embodiment, the ninth variation, and the tenth variation.

In the example of the second embodiment illustrated in FIGS. 10 and 11, the return pipes 45 and 46 are provided and the dropping of the processing liquid from the nozzle 36 is prevented. However, the present disclosure is not limited to this. The return pipe 45 may be provided even in the first embodiment, the first to fourth variations, the sixth variation, the third embodiment, the seventh variation, the eighth variation, the ninth variation, and the tenth variation. In the second embodiment, the return pipes 45 and 46 may not be provided.

In the example of the sixth variation illustrated in FIG. 13, the circulation pipe 47 is provided. However, the present disclosure is not limited to this. The circulation pipe 47 that allows sulfuric acid to circulate therethrough may be provided even in the first embodiment, the first to fourth variations, the second embodiment, the fifth variation, the third embodiment, the seventh variation, the eighth variation, and the fourth embodiment.

In the example of the second embodiment illustrated in FIGS. 10 and 11, sulfuric acid is supplied directly to the nozzle 36 from the upstream tank (tank 51) when two tanks are provided. However, the present disclosure is not limited to this. When two tanks are provided, sulfuric acid may be supplied directly to the nozzle 36 from a downstream tank (tank 50).

In the example of the second embodiment illustrated in FIGS. 10 and 11, the heater 61 is provided. However, the present disclosure is not limited to this. In the second embodiment, the heater 61 may not be provided. In this case, the heater 62 corresponds to the "first heater" in the present disclosure. In addition, the tank 50 corresponds to the "heating region" in the present disclosure.

In the example of the third embodiment illustrated in FIGS. 14 to 16, the substrate processing apparatus 100 includes the shielding member 90. However, the present disclosure is not limited to this. The substrate processing apparatus 100 may include the shielding member 90 and may further include the fluid supply section 130 even in the first embodiment, the first to fourth variations, the second embodiment, the fifth variation, and the sixth variation.

In the example of the third embodiment illustrated in FIGS. 14 to 16, the heater 61 is turned off when the relatively low-temperature sulfuric acid and the hydrogen peroxide solution are mixed in Step S305 (second distribution). However, the present disclosure is not limited to this. If the temperature of sulfuric acid becomes lower than that in step S301 (first distribution), the heater 61 may be turned on.

In the examples of the above-mentioned embodiments, the relatively high-temperature sulfuric acid, the relatively low-temperature sulfuric acid, and the hydrogen peroxide solution are supplied to the substrate W from one nozzle 36. However, the present disclosure is not limited to this. For example, the relatively high-temperature sulfuric acid, the relatively low-temperature sulfuric acid, and the hydrogen peroxide solution may be supplied to the substrate W from two or three nozzles. For example, the relatively high-temperature sulfuric acid and the hydrogen peroxide solution may be mixed on the substrate W, and the relatively low-temperature sulfuric acid and the hydrogen peroxide solution may be mixed on the substrate W.

The invention claimed is:

1. A substrate processing method for processing a substrate by supplying a processing liquid to the substrate, the substrate processing method comprising:
    mixing, as a first mixing, a sulfuric acid having been supplied from a first tank, passed through a first path including a heating region, and been heated in the heating region, and a hydrogen peroxide solution having passed through a hydrogen peroxide supply path so as to produce a high temperature sulfuric acid-hydrogen peroxide mixture;
    ejecting, as a first ejection, the high temperature sulfuric acid-hydrogen peroxide mixture onto a first surface of the substrate;
    mixing, as a second mixing, a sulfuric acid having a lower temperature than a temperature of the sulfuric acid supplied from the first tank and heated, and a hydrogen peroxide solution having passed through the hydrogen peroxide supply path so as to produce a low temperature sulfuric acid-hydrogen peroxide mixture which is lower in temperature than the high temperature sulfuric acid-hydrogen peroxide mixture; and
    ejecting, as a second ejection, the low temperature sulfuric acid-hydrogen peroxide mixture onto the first surface of the substrate, after the first ejection, with the ejection of the high temperature sulfuric acid-hydrogen peroxide mixture being stopped.

2. The substrate processing method according to claim 1, wherein the second mixing includes mixing the sulfuric acid that has passed through a second path without the heating region and the hydrogen peroxide solution.

3. The substrate processing method according to claim 2, wherein the first path and the second path diverge on an upstream side of the heating region in a flow direction of the sulfuric acid, and meet on a downstream side of the heating region in the flow direction of the sulfuric acid.

4. The substrate processing method according to claim 2, further including a first distribution before the first mixing and a second distribution before the second mixing, wherein:
    the first distribution includes heating the sulfuric acid passing through the first path to set a temperature of the sulfuric acid to a first temperature; and
    the second distribution includes setting a temperature of the sulfuric acid passing through the first path to a second temperature lower than the first temperature.

5. The substrate processing method according to claim 1, wherein a temperature of the sulfuric acid in the first tank is maintained at a predetermined temperature.

6. The substrate processing method according to claim 5, wherein a temperature of sulfuric acid in a second tank is maintained at a temperature higher than the temperature of the sulfuric acid in the first tank, the second tank being located on a downstream side of the first tank in a flow direction of the sulfuric acid.

* * * * *